United States Patent [19]

Suwa et al.

[11] Patent Number: 4,908,656
[45] Date of Patent: Mar. 13, 1990

[54] METHOD OF DIMENSION MEASUREMENT FOR A PATTERN FORMED BY EXPOSURE APPARATUS, AND METHOD FOR SETTING EXPOSURE CONDITIONS AND FOR INSPECTING EXPOSURE PRECISION

[75] Inventors: Kyoichi Suwa, Yokohama; Shigeru Hirukawa, Kashiwa; Hiroki Tateno, Kawasaki, all of Japan

[73] Assignee: Nikon Corporation, Tokyo, Japan

[21] Appl. No.: 299,236

[22] Filed: Jan. 19, 1989

[30] Foreign Application Priority Data

Jan. 21, 1988 [JP] Japan ................................. 63-11729
Jul. 20, 1988 [JP] Japan ................................. 63-180654
Jul. 20, 1988 [JP] Japan ................................. 63-180655

[51] Int. Cl.[4] ............................................. G03B 27/42
[52] U.S. Cl. ......................................... 355/53; 355/77; 326/401
[58] Field of Search .................. 355/77, 53, 43, 45; 356/400, 401, 384, 387, 352; 250/548

[56] References Cited

U.S. PATENT DOCUMENTS

| | | | |
|---|---|---|---|
| 4,433,911 | 2/1984 | Sawada et al. | 355/77 X |
| 4,549,084 | 10/1985 | Markle | 356/400 X |
| 4,677,301 | 6/1987 | Tanimoto et al. | 250/548 |
| 4,744,662 | 5/1988 | Suto et al. | 356/378 X |
| 4,772,119 | 9/1988 | Bouwhuis et al. | 356/356 X |
| 4,803,524 | 2/1989 | Ohno et al. | 355/53 |

Primary Examiner—L. T. Hix
Assistant Examiner—D. Rutledge
Attorney, Agent, or Firm—Shapiro and Shapiro

[57] ABSTRACT

An exposure method for use in an apparatus for projecting a pattern formed on a mask onto a photosensitive substrate through a projection optical system, comprises the steps of providing a mask bearing a pattern of which width gradually varies in a reference direction on the mask transferring the pattern onto the photosensitive substrate through the projection optical system measuring the length of pattern transferred onto the photosensitive substrate, in a reference direction on the substrate corresponding to the reference direction of the mask determining optimum exposure conditions for the projection exposure, from thus measured length of the pattern and controlling the exposure according to the conditions.

14 Claims, 19 Drawing Sheets

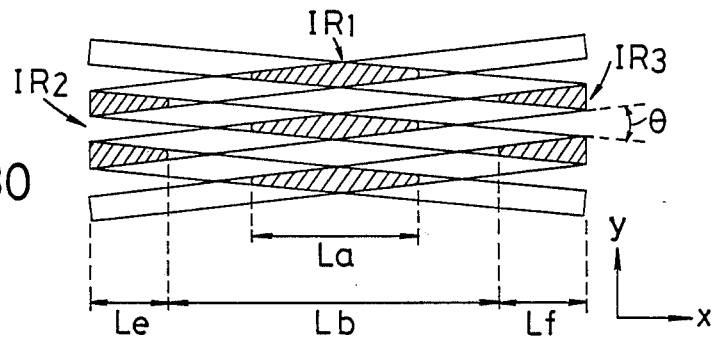
FIG.30
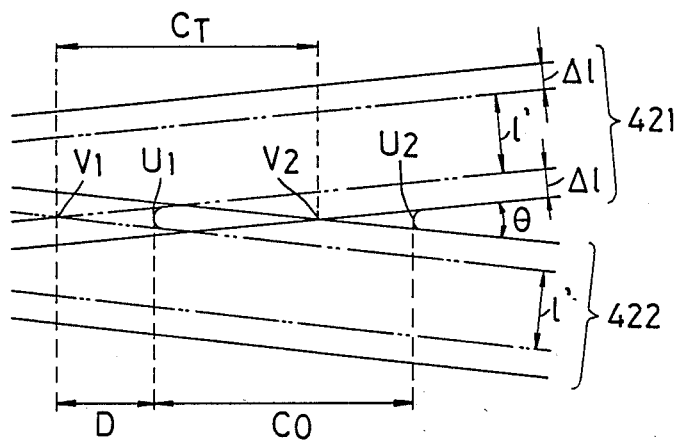
FIG.31
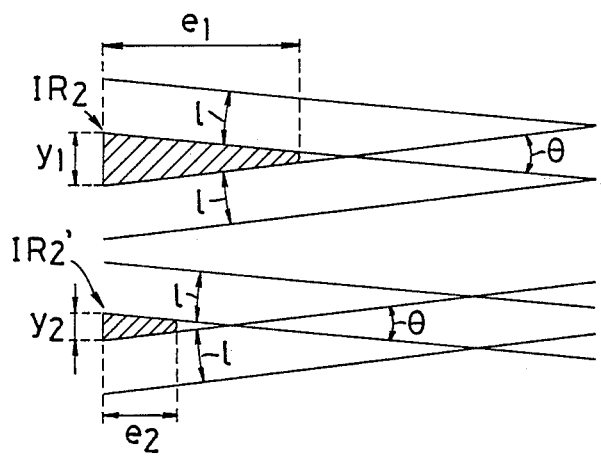
FIG.32A
FIG.32B

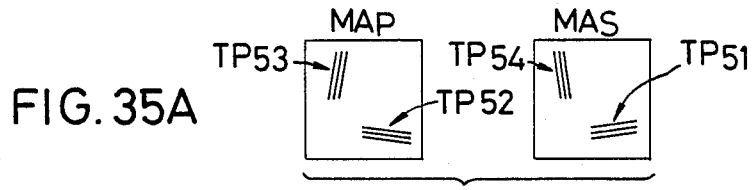
FIG.35A
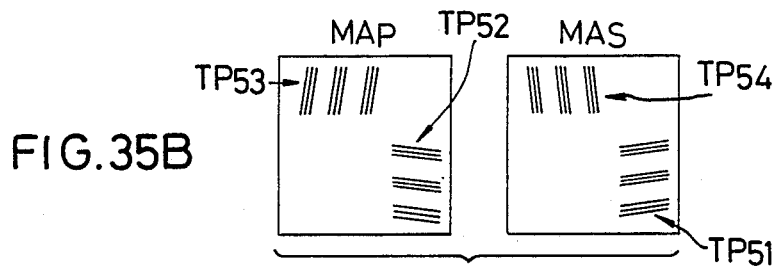
FIG.35B
FIG.36
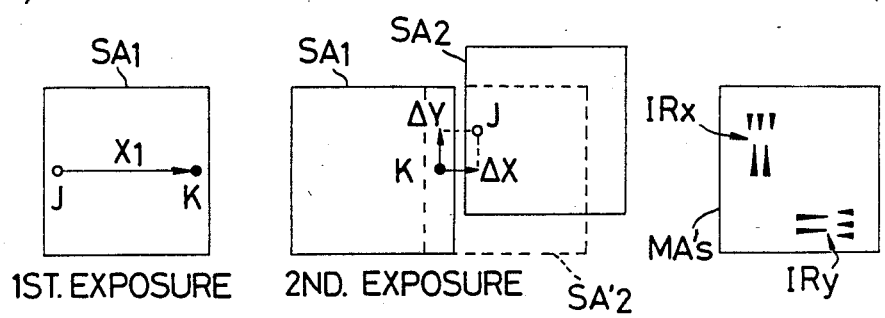
FIG.37
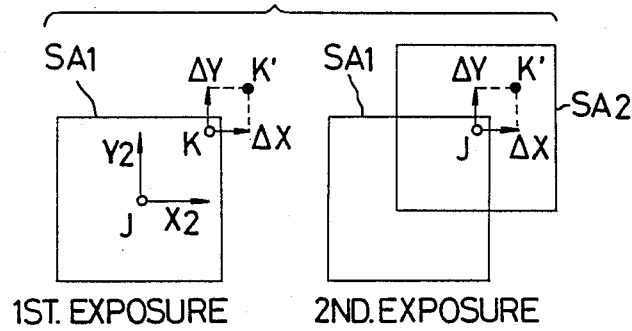

METHOD OF DIMENSION MEASUREMENT FOR A PATTERN FORMED BY EXPOSURE APPARATUS, AND METHOD FOR SETTING EXPOSURE CONDITIONS AND FOR INSPECTING EXPOSURE PRECISION

BACKGROUND OF THE INVENTION

1. Field of the Invention

The present invention relates to exposure of a photosensitive substrate in the preparation of semiconductor devices and liquid crystal display devices, and more particularly a method of determining exposure conditions in an exposure apparatus, especially through the evaluation of dimensions of a pattern formed on the photosensitive substrate by said exposure apparatus, and a method of inspecting the precision of the exposure apparatus.

2. Related Background Art

The conventional exposure apparatus of this kind is provided, for exposing a photosensitive substrate having a layer of photoresist of a predetermined thickness (1–5 $\mu$m) to the image of a pattern (geometrical pattern consisting of light-transmitting areas and opaque areas) formed on an original plate called a mask or a reticle, there is provided an illuminating system for illuminating said mask or reticle from above, with uniform distribution and with substantially constant light intensity for a predetermined period, or an illuminating system for emitting plural pulses from a pulsed laser until a predetermined integrated light amount is obtained. In either case, control is made in such a manner that the pattern of the reticle can be printed onto the photoresist layer with an optimum amount of exposure.

Such exposure control is conducted under very strict conditions such as ±3%, in order to control the pattern width formed on said photoresist layer, with sufficient precision.

On the other hand, the width of the pattern formed on the photoresist layer is significantly influenced by the mechanical distance between mask and the photosensitive substrate in case of proximity exposure system, or by the distance between the photosensitive substrate and the projection optical system, or the focusing error, in case of projection exposure system.

The optimum exposure condition for the photosensitive substrate, particularly the focus condition and amount of exposure, have been determined by a trial exposure on the photosensitive substrate and comparison of the width of developed linear pattern, measured by an optical microscope or a line width measuring apparatus, with the design line width, or by a phenomenon that the line width becomes smallest under certain conditions.

For example, a step-and-repeat exposure apparatus employs an exposure system of stepping the wafer with respect to the reticle, in order form shot areas in matrix shape on said wafer. In the trial exposure, therefore, there is considered a method of varying the amount of exposure (for example the period of shutter aperture) while maintaining a constant focusing in the lateral (x) direction in the matrix arrangement of the shot areas on the wafer, and varying the focusing (for example by 0.25 $\mu$m) while maintaining a constant exposure in the vertical (y) direction in said matrix arrangement.

After the image development, the line width in the photoresist pattern in the shot areas is directly measured, and the optimum exposure conditions are determined by the focusing condition in a shot area in which the line width is smallest among the shot areas of same exposure, and the amount of exposure giving a predetermined line width among the shot areas with said focusing condition.

The conventional technology explained above has been associated with a drawback that the processing speed is extremely slow, since, after the transfer of a pattern formed on a test reticle to a photoresist layer formed on a wafer, the distances of parallel edges of thus formed pattern have to be measured with an optical microscope or an exclusive measuring apparatus. Particularly in case of observing the photoresist pattern with an optical microscope coupled with an ITV camera, said microscope has to be precisely focused, causing severe fatigue on the part of operator. The exclusive measuring apparatus can achieve relative precise line width measurement, but such apparatus has to be made available.

There is an additional drawback: that the error of the pattern formed on the test reticle is directly reflected on the measured width of the photoresist pattern.

In general, in the projection exposure apparatuses, the best focus plane of the projection is scarcely flat in the submicron precision over a field as large as 15×15 mm or 20×20 mm (corresponding to a shot area), but involves a curvature or an inclination of the image plane close to one micron, between the center and the peripheral part of the field.

However, as the depth of focus of the projection lens is as small as ±1 $\mu$m, it is necessary to determine the best imaging plane in order to obtain average focus state over the entire field. For this reason linear patterns or other marks are provided in plural positions on the test reticle in order to obtain such patterns or marks for line width measurement in plural points at the center and peripheral area of each shot area. In such case the error in the line width in such marks and patterns are directly reflected in the line width measurement. It is therefore difficult to precisely determine the image plane curvature or inclination, so that the focusing conditions can only be determined in unprecise manner.

Also the line width measurement of the pattern formed in the photoresist layer can be achieved, in addition to the above-explained method of observation with an ITV camera and measurement of the dimension between the pattern edges through the analysis of thus obtained image signal, by a method of scanning the photoresist image on the wafer with a laser beam spot of several microns in width and determining the width from the correlation between the scattered light intensity from the pattern edges and the scanning position of the laser beam spot, or by a method (SEM method) of scanning the photoresist image with an electron beam spot and determining the width from the correlation between the secondary electron beam intensity from said photoresist image and the scanning position of the electron beam.

Also in order to check the precision of the exposure apparatus, there has been employed a method of employing a test reticle with special vernier patterns, effecting double exposure with a displacement of the wafer in such a manner that the main vernier scale and the auxiliary scale mutually overlap on the wafer and observing the developed photoresist patterns of said vernier scales under a microscope, or another method of printing two parallel linear patterns (constituting a diffraction grating) and measuring the distance of said two linear patterns with the alignment sensor of the exposure apparatus, as disclosed in U.S. Pat. No. 4,803,524.

Among three methods mentioned above, the method employing the ITV camera and the method employing laser beam spot are limited in resolving power, for example by simply detecting the width of a linear photoresist pattern, due to the presence of diffraction. Particularly the latter method is unable to measure the line width smaller than the spot size, which cannot be reduced below the limit of diffraction. Although the former method is simple, it is associated with a drawback that the resolving power and the precision of measurement is directly influenced by the performance of the objective lens of the microscope for observing the photoresist image.

Also the electron beam (SEM) method has been associated with drawbacks of low throughput of measurements and of requiring expensive apparatus, as the wafer specimen has to be measured in a high vacuum chamber, requiring a long evacuating time.

SUMMARY OF THE INVENTION

An object of the present invention is to provide a method for setting the optimum exposure conditions for the exposure apparatus, with a high precision and within a short time.

Another object of the present invention is to provide a measuring method with a high processing speed and less influenced by the production error in the test reticle.

Still another object of the present invention is to provide an automatic set-up method capable of determining the exposure conditions with the alignment sensor provided in the exposure apparatus in easy and precise manner, thereby enabling self administration of the exposure apparatus.

Still another object of the present invention is to provide a measuring method capable of measuring the line width or the pattern edge distance of a fine pattern with a high speed and with a high resolving power, even when a simple optical measuring instrument is employed.

Still another object of the present invention is to provide a method for inspecting the precision or characteristics of the exposure apparatus, with a high precision, without direct measurement of the positional error in the photoresist image.

According to the present invention, there is provided a method of forming, on a substrate, a photoresist pattern with continuously or stepwise varying width in a direction on said substrate, then detecting said photoresist pattern with the alignment optical system of the exposure apparatus or an ITV camera, then determining the optimum conditions according to the result of detection, and controlling the exposure conditions according to said optimum conditions.

Also according to the present invention, there is provided a method of forming two linear patterns, having edges mutually crossing with a predetermined angle, by double exposures on a photoresist layer, and measuring the wedge-shaped or Moire images formed by the superposition of two linear patterns, thereby indirectly measuring the exposure conditions.

Plural partial areas on the substrate are subjected to first exposures (first linear pattern exposures) with varying exposure conditions (varying in focus and energy), and the latent images formed in the photoresist layer are subjected to second exposure (second linear pattern exposure) with again varying exposure conditions.

Then the optimum exposure conditions are determined by comparison of the length of the photoresist images (wedge-like or Moire like) formed in respective partial areas.

According to the present invention, two linear patterns are formed as light-transmitting portions or opaque portions on a test reticle (or a device and said patterns are double exposed on the photoresist layer with a predetermined angle (equal to or smaller than 45° but larger than 0°), and the length of the wedge-shaped or moire-shaped photoresist pattern formed by the double exposures (said length being in a direction oblique to the direction of line width). It therefore becomes unnecessary to directly measure the line width, and the reliability of measurement is improved.

Also the error in the pattern width in the preparation of reticle can be fundamentally eliminated by replacing the function of two linear patterns with a linear pattern formed on the test reticle.

Also if there are prepared plural sets of two linear patterns like a line-and-space pattern, there are obtained, on the photoresist layer, plural wedge- or moire-shaped patterns. By averaging the dimensions of said plural patterns, it is rendered possible to average the fluctuation in the patterns on the reticle, thereby reducing the influence of error in the pattern width at the preparation of the reticle.

Also according to the present invention, there is provided a method of forming two linear patterns having edges mutually crossing with a predetermined angle, through double exposures on the photoresist layer, and measuring the dimension of the wedge- or moire-shaped photoresist images, formed by superposition of two linear patterns, thereby determining the line width or positional aberration of said two linear patterns.

BRIEF DESCRIPTION OF THE DRAWINGS

FIG. 30 is a plan view of a photoresist pattern;

FIGS. 31, 32A and 32B are views showing the mode of line width measurement;

FIGS. 35A and 35B are views showing different examples of linear patterns formed on the test reticle for measuring the positional aberration;

FIG. 36 is a view explaining the method of inspecting the stepping precision;

FIG. 37 is a view explaining the method of inspecting the image magnification and distortion;

DESCRIPTION OF THE PREFERRED EMBODIMENTS

[1st embodiment]

A reduction projection exposure apparatus projects a test pattern on a reticle, onto a photosensitive substrate such as a wafer, thereby transferring the test pattern onto said substrate in a manner to be explained later.

Figure 1:
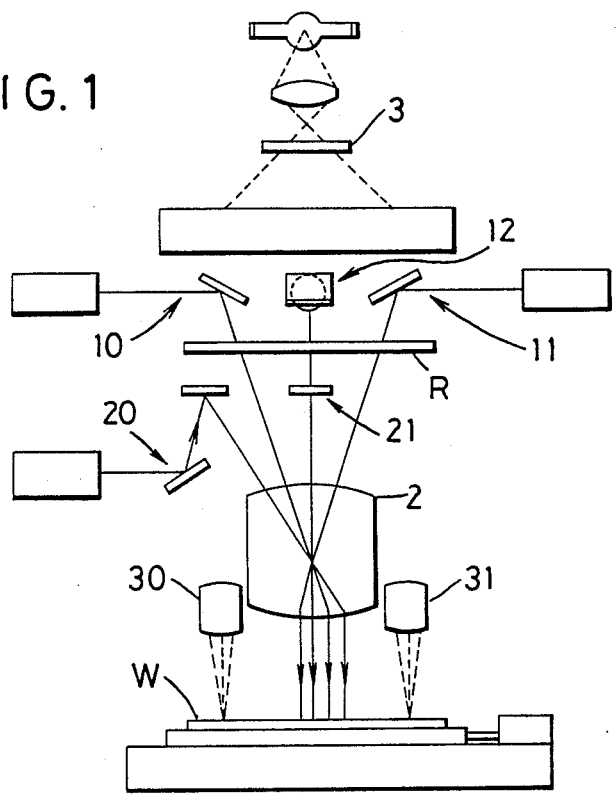
FIG. 1 is a front view of a projection exposure apparatus constituting a first embodiment of the present invention.

For said projection exposure apparatus, there can be utilized, for example, a stepper as disclosed in the U.S. Pat. No. 4,677,301. In said stepper, as shown in FIG. 1, a reduction projection lens 2 is provided between a reticle R and a wafer W. Said wafer W is supported, on a stage capable of moving in x, y and z directions, by a wafer holder capable of rotation $\theta$.

Said stepper is further equipped with three optical systems for alignment of the reticle R and the wafer W. The first one is a die-by-die alignment (DDA) system 10, 11, 12 for simultaneous observation of an alignment mark on the reticle and an alignment mark on the wafer through the projection lens. The second one is a laser step alignment (LSA) system 20, 21 for irradiating an alignment mark composed for example of a diffraction grating formed on the wafer with a light spot, generating an output signal in response to the light diffracted or scattered from said mark, and determining the position of the mark from said output signal and the position of the wafer stage. The third one is a wafer alignment system 30, 31 of off-axis method.

Figure 2:
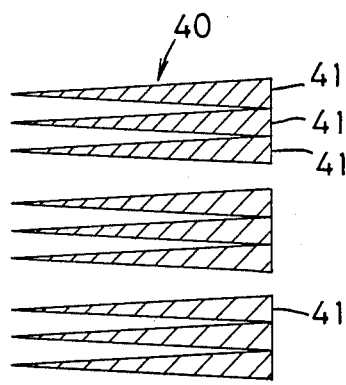
FIG. 2 is a view showing the arrangement of test patterns on a reticle.

On the reticle R there is formed a test pattern 40 as shown in FIG. 2. Said test pattern 40 is composed of three sets of patterns, each consisting of three wadge shaped pattern elements 41, arranged in parallel manner along horizontal direction. The pattern elements in each set are joined at the bottom of the wedge-shaped elements, and are of a same shape and a same dimension.

The stepper executes plural exposure on a substrate, such as a wafer, changing in succession at least either of the focusing position of the projection lens and the amount of exposure, by suitably driving a shutter 3 provided in the illumination system and the Z-stage, thereby transferring the test pattern 40 of the reticle, onto plural positions of the substrate. As an example, plural exposures are executed with a constant amount of exposure and with stepwise varied positions of the focus of the projection lens or stepwise varied axial positions of the wafer stage, thereby forming plural projected images in a first column on the substrate. Then plural exposures are executed with a constant but slightly different amount of exposure and with stepwise varied positions of focusing to form plural projected images in a second column. This operation is repeated in succession to form a plurality of projected images of the test pattern, arranged in a matrix on the substrate. Consequently the projected images arranged in a matrix are different in the amount of exposure in the direction of row, and in the focus position in the direction of column.

When a positive photoresist is employed, photoresist patterns are formed on the substrate by developing thus exposed substrate. These photoresist patterns have mutually different dimensions and shapes corresponding to the difference in the exposure conditions.

Figure 3:
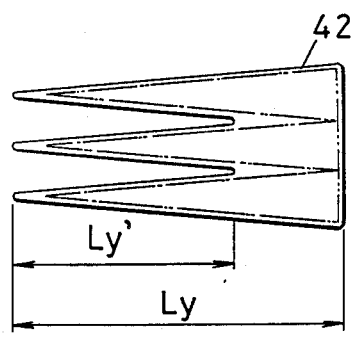
FIGS. 3 and 4 are plan views showing photoresist patterns formed on a wafer.
Figure 4:
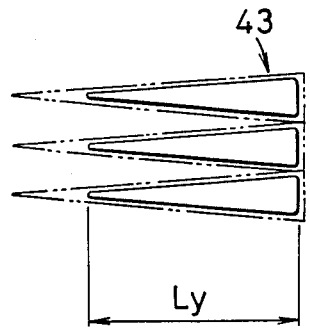

FIGS. 3 and 4 illustrate some of the photoresist patterns on the substrate. The chain lines indicate the projected images of the original test pattern on the reticle.

A resist pattern 42 is formed for example in case of a deficient exposure, while a resist pattern 43 is formed in case of an excessive exposure. In either case, the change in dimension from the original projected image is represented, in enlarged manner, by the entire length Ly of the wedge-shaped photoresist pattern, or a length Ly' from the position of mutual joining of the adjacent pattern elements to the pointed end thereof.

It is therefore possible to determine the optimum exposure conditions, by determining, in advance, the relationship between the various exposure conditions such as focus position, amount of exposure etc. and the length of the wedge-shaped photoresist pattern, and measuring the length of said photoresist pattern on the substrate.

Figure 5:
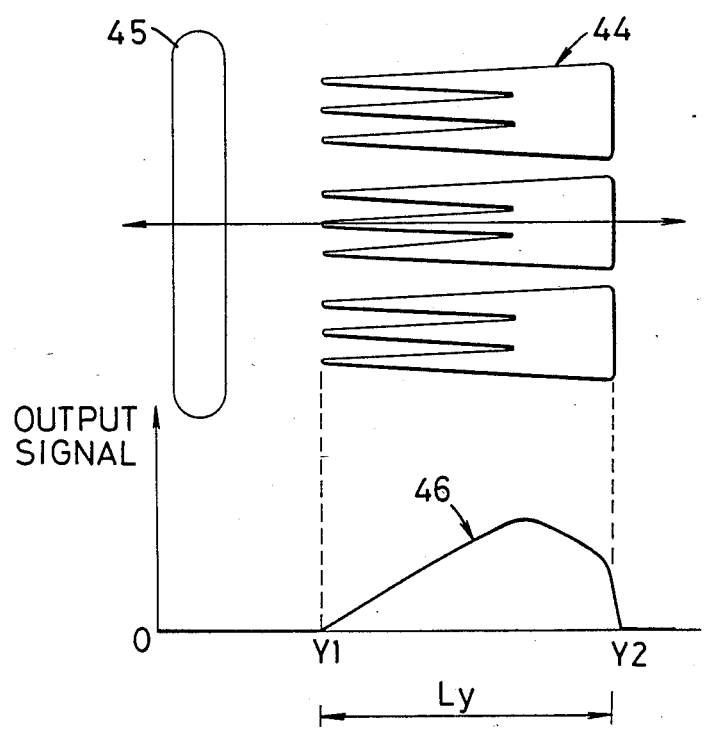
FIG. 5 is a schematic view showing the mode of scanning of photoresist patterns with a light beam spot.

The photoresist patterns formed on the substrate are detected with the LSA system 20 equipped in the stepper. As shown in FIG. 5, the LSA system 20 projects a beam spot 45, extended parallel to the direction of arrangement of the elements of the photoresist pattern 44, and the wafer stage is moved in such a manner that the patterns 45 are scanned, as shown by an arrow, with said beam spot. During said scanning movement, the detector in the LSA system receives the light diffracted or scattered by the photoresist patterns, through the projection lens, and generates a corresponding output signal 46.

Based on positions Y1, Y2 determined from said output signal, the length Ly of the photoresist pattern 44 is determined and stored in a memory.

In this manner the length is measured and stored for plural photoresist patterns formed on the substrate.

The optimum focus position of the projection lens and the optimum amount of exposure are determined from the lengths Ly of patterns. More specifically, among the photoresist patterns formed with a constant amount of exposure and with gradually varied focus position, arranged in the direction of column in the matrix, a focus position giving the largest pattern length Ly is determined, and is stored as the optimum focus position of the projection lens. Then, among the photoresist patterns arranged in the direction of row of the matrix corresponding to said optimum focus position, an amount of exposure, when a pattern of which length is equal or substantially equal to the predetermined length is projected, is determined as the optimum exposure.

The shutter 3 and the Z-stage are controlled according thus determined optimum focus position and amount of exposure.

In the following there will be explained a method of detecting inclination and curvature of the image plane of the projection lens, utilizing the wedge-shaped test patterns in the present embodiment.

Figure 6:
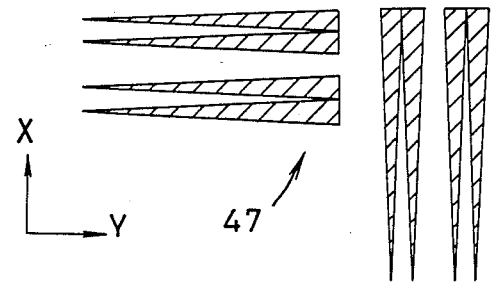
FIG. 6 is a view of a variation of the test patterns on the reticle.
Figure 7:
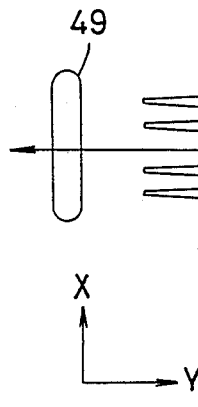
FIG. 7 is a view showing the mode of scanning of the photoresist pattern with a light beam spot.

Test patterns 47 are respectively formed in plural positions including the vicinity of the optical axis on the reticle R and the peripheral areas thereof. As shown in FIG. 6, each test pattern 47 is composed of wedge patterns in the X-direction and those in the y-direction. Said reticle R is employed in making plural shots on the photosensitive substrate, with an arbitrary constant amount of exposure and with successively varied focus positions. Thus photoresist patterns 48 as shown in FIG. 7 are formed in plural sets on the substrate. Then the lengths of said patterns in the X and Y directions are detected with beam spots 49, 50 of the LSA systems 20, 21 to determine the focus position in various positions in the exposure field. The focus positions in the field can be utilized for determining the inclination and curvature of the image plane, and the astigmatism at each position.

It is also possible to determine the unevenness of the line width, caused for example by uneven illumination in the exposure field, by transferring the images of wedge test patterns distributed over the entire area of the reticle onto the photosensitive substrate with an arbitrary fixed amount of exposure, detecting the lengths of thus formed photoresist patterns and correlating thus detected lengths with data stored in advance.

It is furthermore possible to determine the unevenness in the line width of photoresist patterns, resulting for example from uneven development, by projecting the wedge pattern in different positions on the wafer and comparing the lengths of said patterns.

Figure 8:
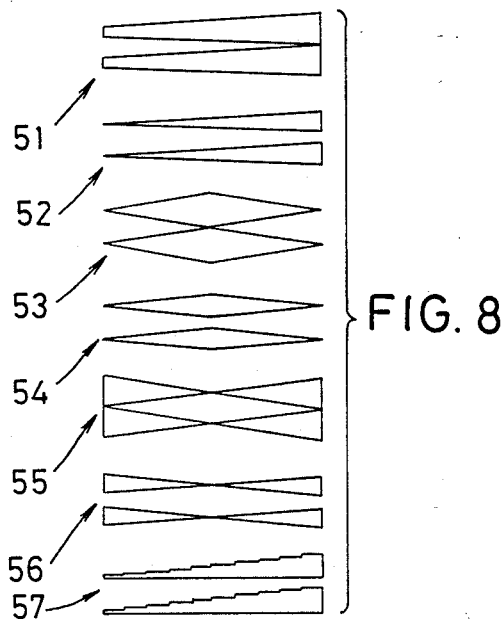
FIG. 8 is a view of various test patterns.

FIG. 8 shows variations of the wedge-shaped pattern. There are shown a pattern 51 with unpointed ends; patterns 52, 54, 56 in which the pattern elements do not mutually contact; patterns 53, 54 pointed in both directions from the center; patterns 55, 56 made wider in both directions from the center; and a pattern 57 with stepwise varying width.

Figure 9:
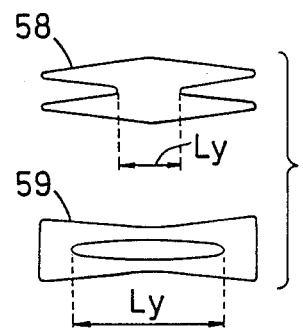
FIG. 9 is a view showing various photoresist patterns.

A pattern 53 or 54 provides a photoresist pattern 58 shown in FIG. 9, and, in this case, the length Ly is measured between two positions where neighboring pattern elements are joined. The patterns 55, 56 also provide a photoresist pattern 59 as shown in FIG. 9.

Figure 10:
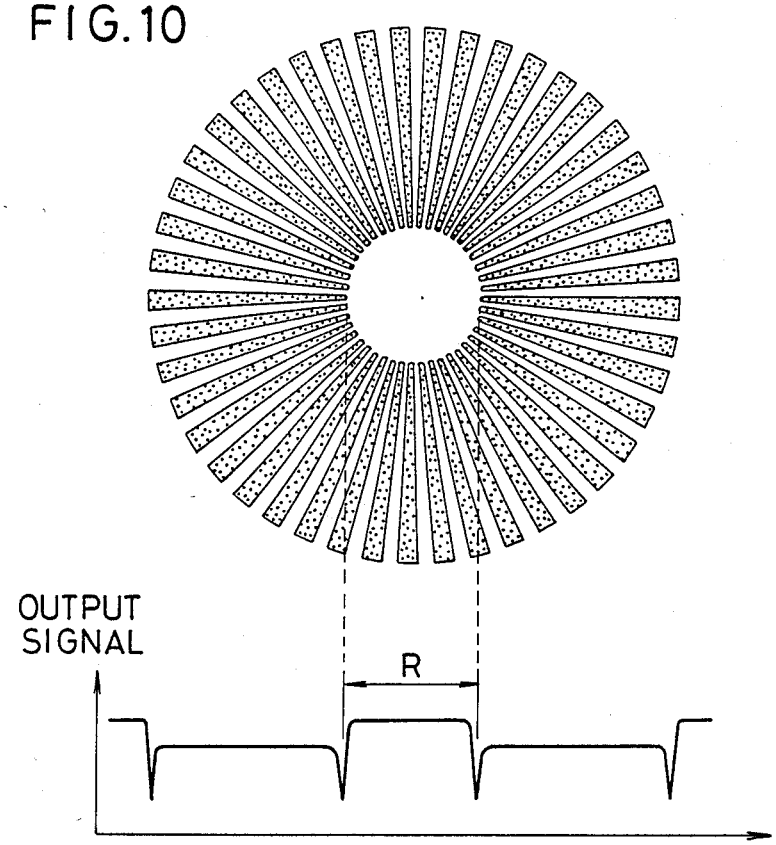
FIG. 10 is a view of radial photoresist patterns.

Also the test pattern may be composed of plural wedge-shaped pattern elements arranged in a radial manner FIG. 10 shows an example of the photoresist pattern formed with such radial test pattern.

The central circle of the radial photoresist patterns assumes a minimum diameter at the optimum focus position, for a given amount of exposure. Thus, at a focus position giving the smallest circle R detected by the output signal, the optimum exposure can be determined when the diameter R is substantially equal to the predetermined diameter.

For pattern detection in the present embodiment, there may be employed not only the LSA system 20, 21 but also other alignment optical systems (DDA system 10, 11, 12; or wafer alignment system 30, 31). For example in the use of the DDA system, the test pattern and the photoresist pattern RP are simultaneously observed under magnification, and the image observed with an image sensor such as ITV are subjected to one- or two-dimensional image processing, and the length or diameter of the photoresist pattern is determined from the obtained image signals.

[2nd embodiment]

Figure 11:
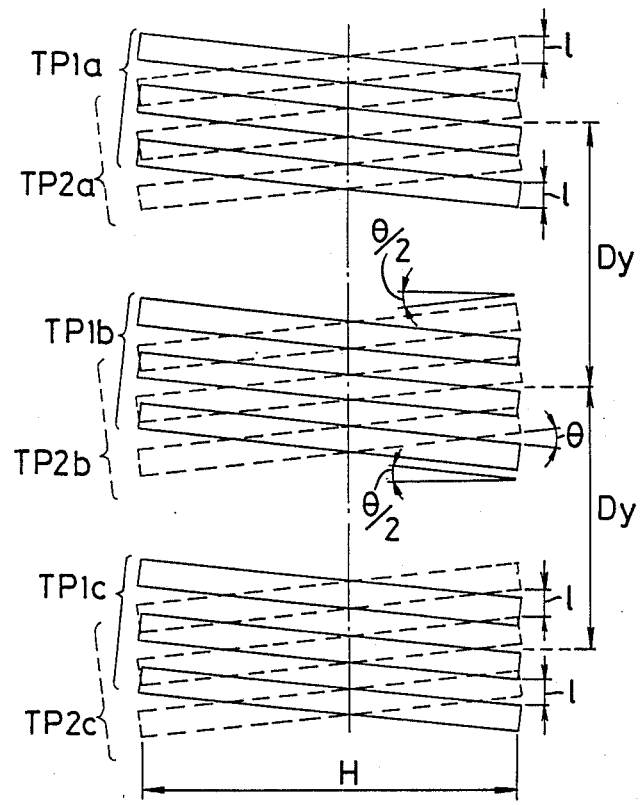
FIG. 11 is a view of a test pattern on a reticle to be employed in a second embodiment.

At first there will be explained the working principle of the present embodiment. FIG. 11 illustrates double exposures of linear patterns. In the first exposure, pattern groups $TP_{1a}$, $TP_{1b}$ and $TP_{1c}$ (or collectively called $TP_1$), each consisting of three linear patterns of a width l, a length H and a spacing l, are exposed with a clockwise angle of $\theta/2$ with respect to the X-axis, and with a mutual pitch Dy among said groups. In the second exposure, pattern groups $TP_{2a}$, $TP_{2b}$ and $TP_{2c}$ (or collectively called $TP_2$), each consisting of three linear patterns of a width l, a length H and a spacing l, are exposed with an anticlockwise angle of $\theta/2$ with respect to the X-axis, and with a mutual pitch Dy among said groups along the Y-direction.

If each linear pattern in the groups $TP_1$, $TP_2$ is opaque, for example composed of a chromium layer, flattened parallelogram areas are left unexposed in the overlapping portions of the pattern groups $TP_1$ and $TP_2$. On the other hand, if said linear patterns are light-transmitting, the areas corresponding to either of the pattern groups $TP_1$, $TP_2$ are all exposed. In the present invention, said linear patterns may be light-transmitting or opaque, and the photoresist used on the substrate may be positive or negative type.

Figure 12:
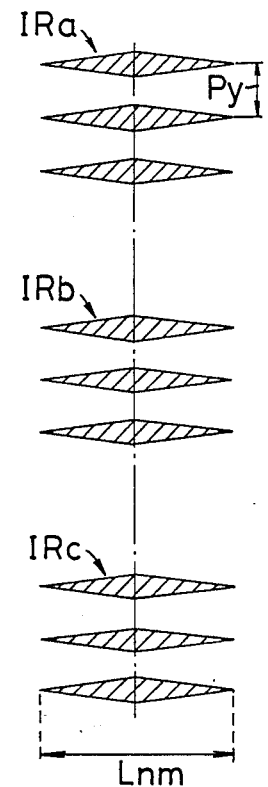
FIG. 12 is a view of a photoresist pattern on a wafer.

FIG. 12 illustrates photoresist patterns IRa, IRb, IRc (collectively called IR) obtained by using positive photoresist in combination with opaque linear patterns in the groups TP1, TP2, in which each of the patterns IRa, IRb, IRc consists of three parallelogram photoresist images (called moire-shaped or wedge-shaped) which are extended along the X-direction with an angle $\theta$ and are arranged with a pitch Py in the Y-direction. In this case, the parallelogram photoresist images remain, after the development, with a thickness of 1–5 μm on the substrate.

If two pattern groups TP1, TP2 are superposed without mutual positional aberration, the theoretical length Lnm of the photoresist patterns IR in the X-direction can be derived from a geometrical calculation, which can be approximated as follows, for a small crossing angle $\theta$:

$$Lnm = \frac{l}{\tan\theta/2} \quad (1)$$

As will be apparent from the equation (1), if the half angle $\theta/2$ of the crossing angle $\theta$ of two linear patterns is selected equal to a small value not exceeding 45° (for example in the order of several degrees), $\tan\theta/2$ assumes a value smaller than 1, so that a change in the width $l$ of the linear pattern is amplified in the length Lnm of the photoresist pattern by a factor of $1/\tan\theta/2$, which is larger than unity.

Figure 13:
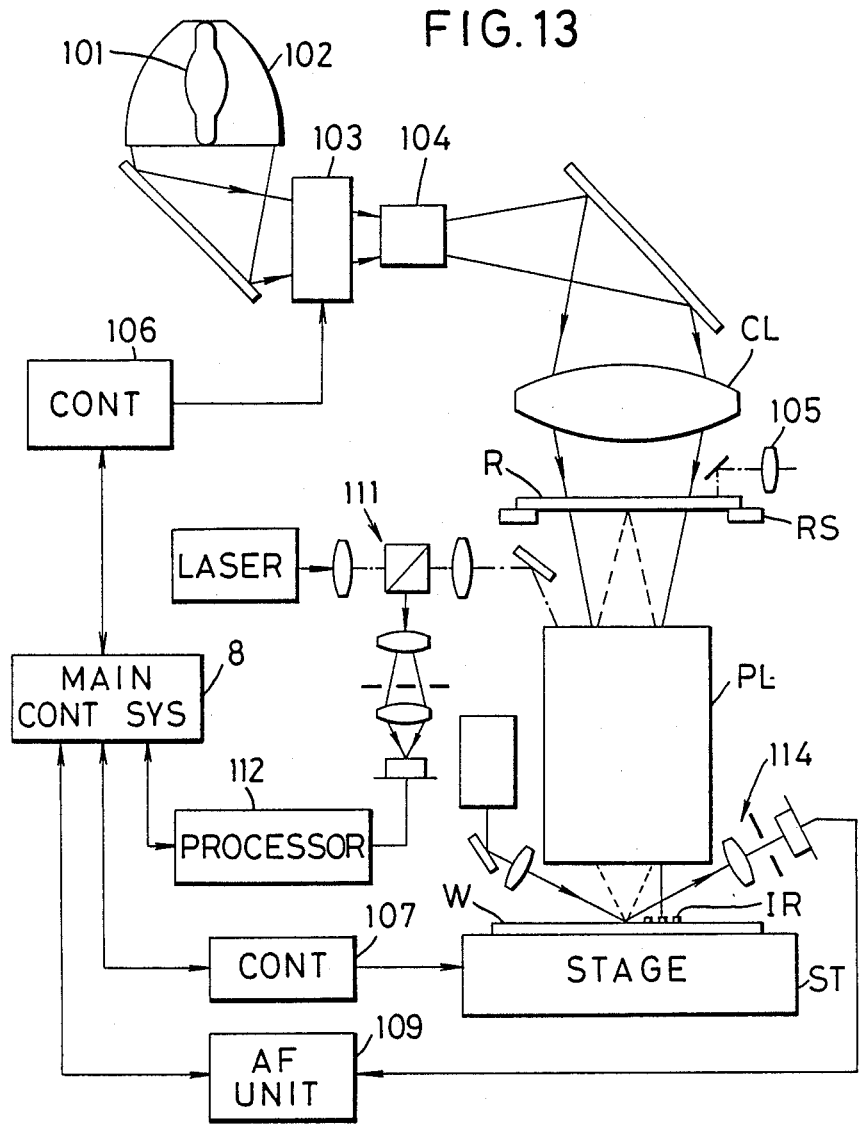
FIG. 13 is a view showing the structure of a projection exposure apparatus.

FIG. 13 illustrates the structure of a reduction projection exposure apparatus (stepper) employed in the present embodiment.

Light of g-line or i-line emitted from an exposure light source, composed for example of a mercury discharge lamp 101 is at first concentrated by an elliptic mirror 102, then passes a shutter 103 for exposure control, then made uniform in intensity by an optical integrator 104, and illuminates a reticle R through a main condenser lens CL. If the emission intensity of the discharge lamp 101 is substantially constant, there is always obtained a desired illumination intensity by controlling the opening period of the shutter 103 with a shutter controller 106.

The reticle R is supported by a reticle stage RS movable in two dimensions (X, Y and rotation), and the light transmitted by the patterns formed on the pattern area of the reticle R is projected onto the wafer W, through a projection lens PL which is telecentric at the image side. The initial setting of the reticle R is achieved by minute movements of the reticle stage RS, according to a mark detection signal from the reticle alignment system 105 for photoelectrically detecting the alignment marks formed on the peripheral portions of the reticle.

On the other hand, a wafer stage ST moves the wafer W in stepping motion with a predetermined amount in the X- and Y-directions, thereby exposing each of the shot areas on the wafer to the image of the pattern area of the reticle R. Said wafer stage ST moves also in case of photoelectric detection of various patterns (alignment marks and photoresist patterns) on the wafer W. Said wafer stage ST is controlled by a stage controller 107, which is provided with a driving motor and a laser interferometer for measuring the coordinate values of the stage ST.

There is provided a wafer alignment system 111 of TTL type (corresponding to the LSA system in the first embodiment) for projecting a slit-shaped light spot onto the wafer W through the projection lens PL and extracting the optical information from the patterns irradiated by said light spot, particularly the diffracted or scattered light, through the projection lens PL. A laser beam from a He-Ne laser or an Ar laser is guided through a lens system containing cylindrical lenses and a beam splitter and deflected by a mirror in such a manner that it passes through the center of the entrance pupil of the projection lens PL. The laser beam perpendicularly irradiates the wafer W from an off-axis position of the projection lens PL, thereby forming a slit-shaped beam spot extended in a direction on the wafer W. The light returning from the wafer inversely passes through the projection lens PL, is then reflected by a beam splitter, further guided through a pupil relay system and a spatial filter, and is received by a photoelectric sensor. Out of the light returning from the wafer W, the photoelectric sensor only receives the diffracted and scattered light. The laser beam emerging from the objective lens 10 has such numerical aperture that the cross section of the beam is relatively small at the center of pupil of the projection lens PL. Consequently, even if the projection lens PL itself has a large numerical aperture, the laser beam on the wafer has a relatively small numerical aperture. This means that the beam has a larger depth of focus and is less influenced by the defocus, in detecting various patterns on the wafer.

The photoelectric signal from the photoelectric sensor of the alignment system 111 enters a signal processing system 112 for detecting the mark position, based on the wave form corresponding to the profile of the mark pattern. In this operation, the signal processing system 112 samples the signal wave form obtained from the photoelectric sensor at the relative movement of the light spot and the wafer W, utilizing the position measuring pulses (for example a pulse at every 0.02 $\mu$m) from the laser interferometer in the stage controller 107.

In the printing of the pattern of the reticle R onto the wafer, it is necessary to exactly match the best image plane of the projection lens PL with the surface of photoresist on the wafer. For this reason, in the present embodiment, there is provided a focus detecting system (AF sensor) 114 as disclosed in the U.S. Pat. No. 4,650,983. Said AF sensor releases a signal indicating a focused state when the best image plane coincides with the surface of the wafer W, and, if the wafer surface is vertically displaced from the best image plane, it releases a signal corresponding to the amount of said displacement (for example ± several microns). The AF signal indicating such focused state or defocus is processed by a focus control unit (AF unit) 109.

The wafer stage ST is further equipped with a Z-stage for slight movement of the wafer W in the axial direction and a $\theta$ stage for slight rotation of the wafer W in the X-Y plane, and effects automatic focusing under the control of the stage controller 107 in response to said AF signals. In a part of the optical system of the AF unit, or in the AF unit, there is provided an offset unit for shifting the actual surface position of the wafer, for which the AF signal indicates the focused state, in the axial direction of the projection lens PL, and an arbitrary amount of offset can be set into said offset unit from main control system 108.

In the double exposures in the present embodiment, predetermined amounts of shift are set in succession into said offset unit.

The main control system 118 not only controls the functions of the stepper, but is provided with a measuring algorithm for automatic setting of the exposure conditions, as will be explained later.

Figure 14:
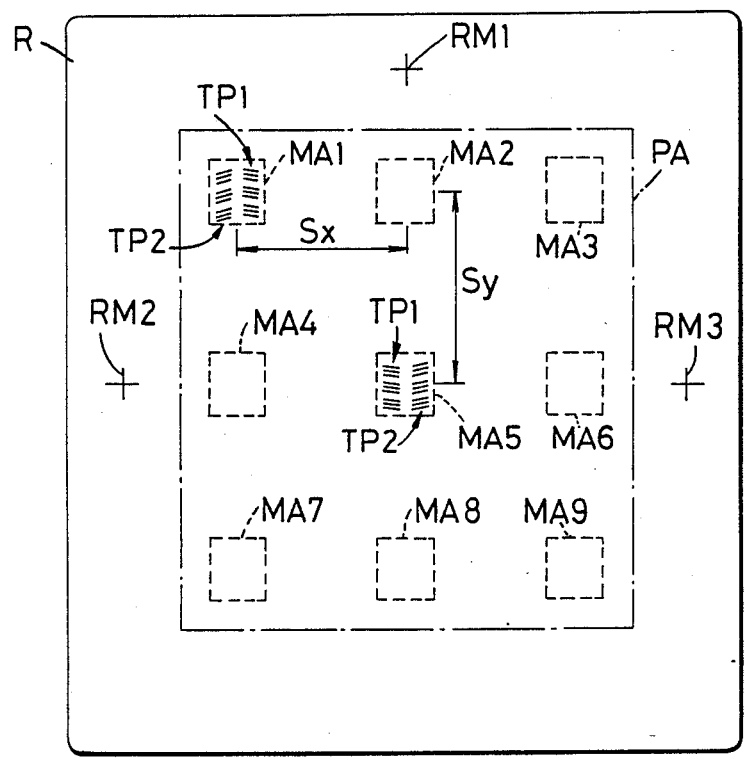
FIG. 14 is a plan view of pattern arrangement on a test reticle suitably employed in the second embodiment.

FIG. 14 shows an example of patterns of the test reticle R suitable for measuring the exposure conditions, and such test reticle is mounted on the reticle stage RS, instead of the device reticle. Said test reticle R is provided, in three positions in the peripheral area, with marks RM1, RM2, RM3 which are to be detected by the reticle alignment system 105 and are of a same arrangement as in the device reticle. A pattern area PA is formed inside said marks. In said pattern area PA, there are for example formed nine mark areas MA1, MA2, MA3, MA4, MA5, MA6, MA7, MA8 and MA9, arranged in 3 x 3 matrix. Said mark areas are mutually separated by distance Sx and Sy respectively in the X and Y directions, and the mark area MA5 is positioned at the center of the pattern area PA or of the reticle.

In each of the mark areas MA1–MA9, there are formed two groups TP1, TP2 of linear patterns as shown in FIG. 11, arranged along the X-direction. It is preferable that the arrangement of the pattern groups TP1, TP2 in the central mark area MA5 is opposite, with respect to the X-direction, to those in other mark areas MA1–MA4, MA6–MA9.

The presence of linear pattern groups TP1, TP2 in plural positions in the pattern area PA allows to measure the focusing condition (or line width) at each point in the shot area (exposure field of the projection lens PL).

In the following there will be explained the measuring method of the present embodiment. At first there will be explained a lithographic system suitable therefor.

Figure 15:
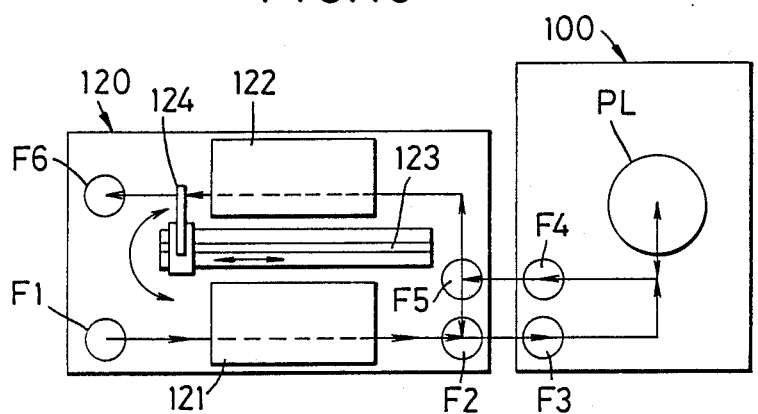
FIG. 15 is a plan view of a stepper and an in-line coater-developer.

FIG. 15 shows in-line combination of the stepper 100 shown in FIG. 13 and a coater-developer 120 (apparatus integrally having a photoresist coating unit and a developing unit), with an improvement in the coater-developer for efficiently conducting the method of the present embodiment.

At first a wafer to be exposed is placed in a position F1 on the coater-developer 120, then moves through a photoresist coating unit and a drying unit, and is stopped at a buffer position F2. When the stepper 100 starts exposure, the wafer is transported from the position F2 to a load position F3 of the stepper 100, then transferred onto the wafer stage ST and is subjected to exposures. After the exposure operation, the wafer is taken out from the stage ST, and is transferred through an unload position F4 and a branching position F5 of the coater-developer 120 to the developing unit 122. The wafer developed therein is stored in a takeout position F6 of the coater-developer 120. Between the photoresist coating unit 121 and the developing unit 122 there are provided linear guide rails 123, along which moves a transport arm 124 for moving the wafer. Said arm 124 supports the wafer coming out of the developing unit 122 and transfers said wafer along the guide rails 123 to the branching position F5. The developed wafer is further transported from said branching position F5 to the buffer position F2, for reloading into the stepper 100.

Such in-line structure involving the coater-developer 120 enables to return the developed wafer immediately to the stepper 100, for observation and measurement of the photoresist images with the alignment system of the stepper.

Figure 16:
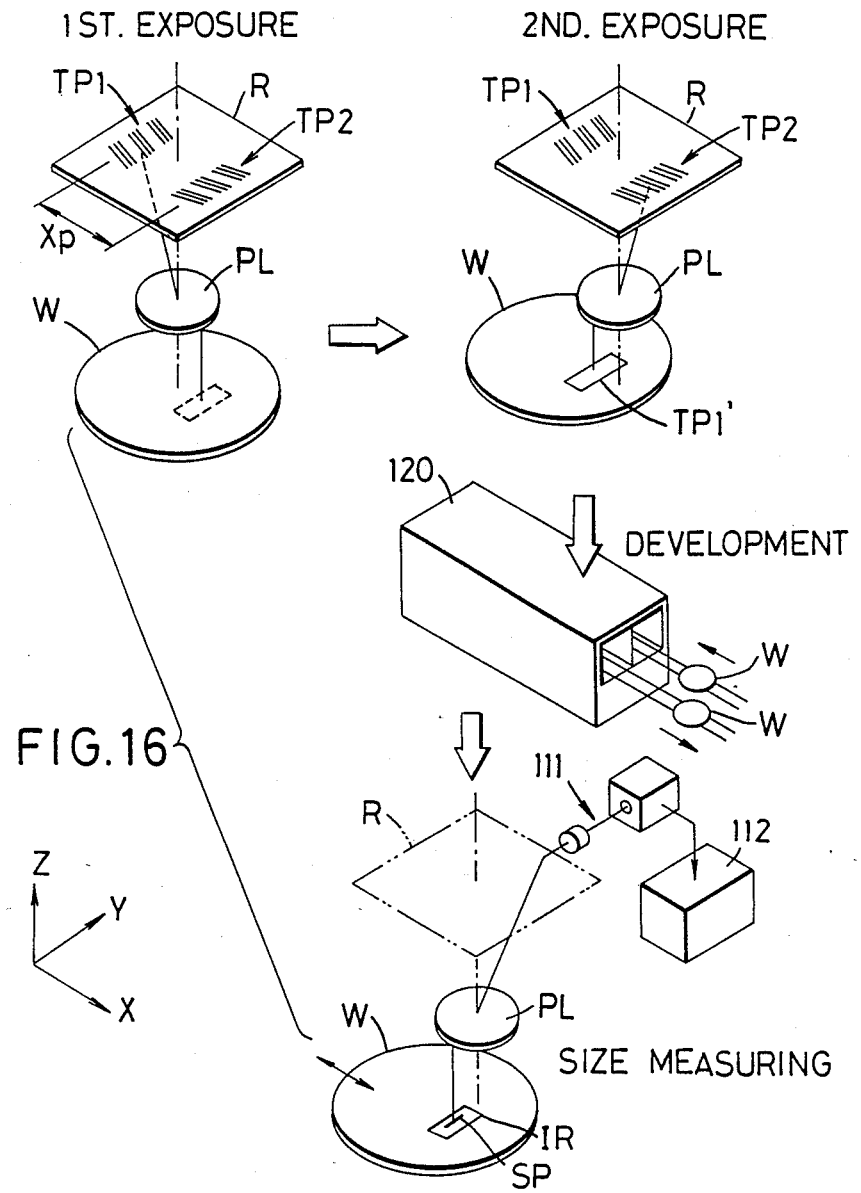
FIG. 16 is a perspective view schematically showing the procedure of determining the exposure conditions in the second embodiment.

FIG. 16 schematically illustrates the steps of the method of the present embodiment, including a first exposure, a second (double) exposure, formation of photoresist patterns by development, and dimensional measurement of the photoresist patterns.

Within a mark area on the test reticle R, two linear pattern groups TP1, TP2 therein are mutually separated by Xp in the X-direction.

In the first exposure, the images of the linear pattern group TP1 are projected onto the wafer W to form latent images on the photoresist layer. Simultaneously the projected images of the linear pattern group TP2 are formed, but they are not doubly exposed in this state.

Figure 17:
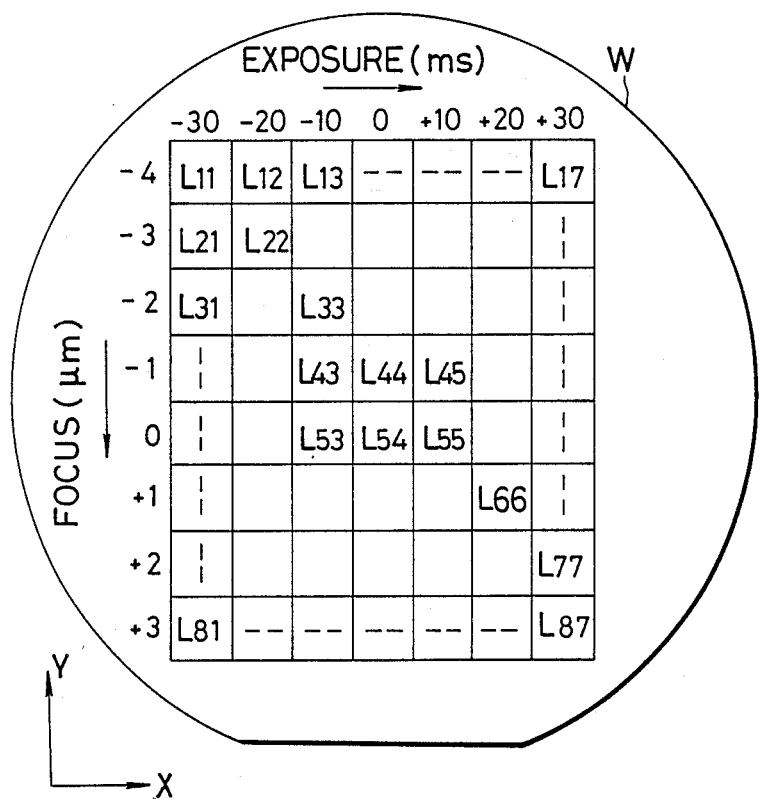
FIG. 17 is a view showing an example of arrangements of shots on a wafer, subjected to double exposures for determining the exposure conditions.

In said first exposure operation, there are for example formed 56 shots in a matrix arrangement of 7×8 shots on the wafer as shown in FIG. 17, and said shot areas are exposed to the image of the pattern area PA of said test reticle R in succession by a step-and-repeat method.

In these exposures, 7 shot areas arranged in the X-direction are given successively varying offsets in the amount of exposure. More specifically, the shutter controller 106 is given an instruction to change the exposure by 10 msec according to the shot position in the X-direction. In FIG. 17, a shot at the center in the X-direction is given an exposure time (for example 200 msec) considered appropriate for the photoresist layer, and this shot is considered to contain zero offset. Thus the shots arranged in the X-direction are given, in succession, offsets of −30, −20, −10, 0, +10, +20 and 30 msec.

On the other hand, the eight short areas arranged in the Y-direction are given successively varying offsets in the focusing conditions. More specifically, the offset unit in the AF unit 109 is given an instruction to shift the focus position for example by 0.25 μm in the shots arranged in the Y-direction.

In the example shown in FIG. 17, the shot areas arranged in the Y-direction are respectively given focus offsets of −4, −3, −2, −1, 0, +1, +2 and +3, wherein the negative and positive signs indicate the direction of offset (negative or positive respectively if the wafer W is positioned closer to or farther away from the projection lens PL). A zero focus offset means the best focus position initially set by the AF sensor, but the best image plane of the projection lens PL does not necessarily coincide exactly with the surface of the wafer W (for example within a range of 0.25 μm).

As explained above, the 56 shots have mutually different exposure conditions, which are stored in the main control system 108 and automatically realized in the first exposure with the step-and-repeat method.

Then the second exposures are conducted as shown in FIG. 16. This is simply achieved by repeating the exposure conditions for the first exposures. It is to be noted, however, in order to precisely superpose the projected images of the linear pattern group TP2 with the latent images TP1' of the linear pattern group TP1 formed in the photoresist layer by the first exposure, that the stepping positions of the wafer stage ST for the 56 shots have to be shifted by m·Xp (wherein m is the reduction rate of the projection lens, for example 1/5 or 1/10) in the X-direction, with respect to the positions of first exposures. This control is quite easily achievable with the laser interferometer of the stage controller 107.

Thus 56 shots are exposed by the step-and-repeat method, with varying offsets in the amount of exposure and in the focusing, as in the first exposures. Naturally the number of offset levels and the difference between two offset levels can be arbitrarily selected.

The wafer exposed as explained above is automatically transported to the coater-developer 120 for the development of the photoresist. After the development, the wafer is transported by the arm 124 to the position F5, and is again introduced into the stepper 100 through the position F2. The stepper 100 automatically places the transported wafer on the wafer stage ST.

Then the stepper 100 conducts the dimension measurement by scanning of the photoresist patterns IR on the wafer with the slit-shaped light spot, utilizing the TTL wafer alignment system 111 and the signal processing system 112.

Figure 18:
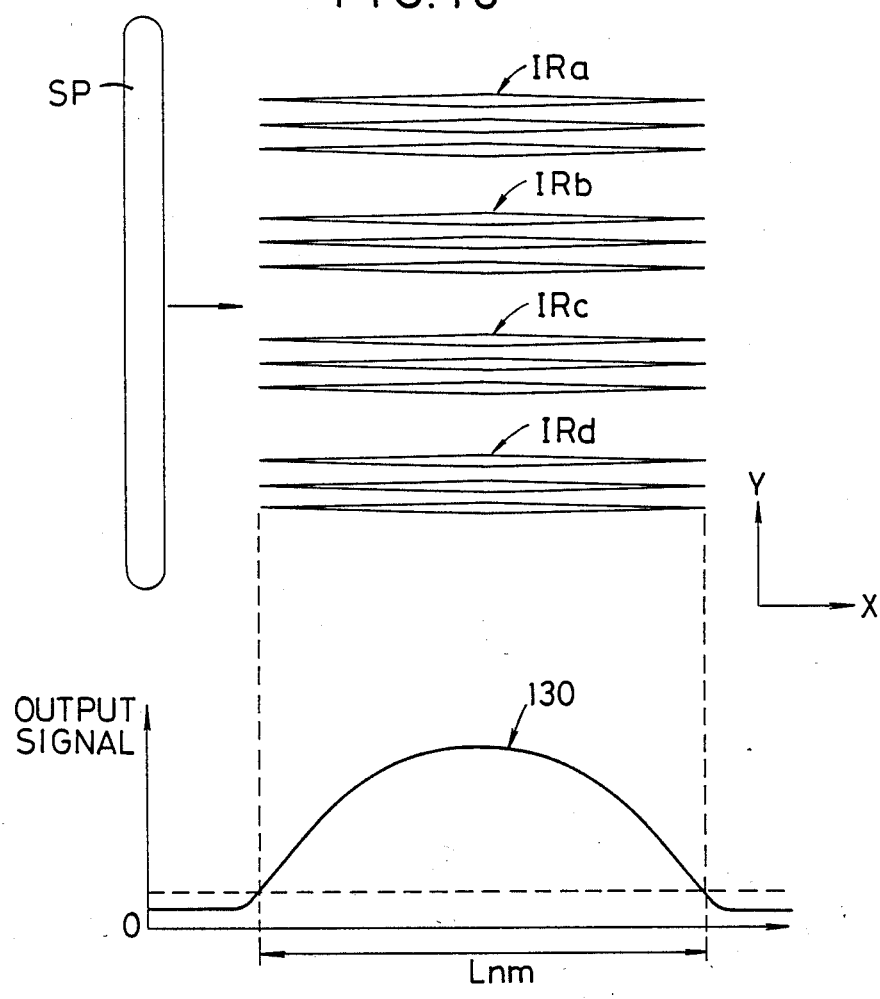
FIG. 18 is a view showing the mode of measurement of photoresist patterns with the alignment system of the stepper.

FIG. 18 illustrates the mode of said measurement. The light spot is extended in the Y-direction, and the scanning operation is conducted in the X-direction. Each of the photoresist patterns IRa, IRb, IRc, IRd formed for example in the centers of shot areas, has three moire-shaped patterns extended in the X-direction and arranged at a certain pitch in the Y-direction. When such photoresist patterns IRa–IRd are scanned with the light spot SP, scattered light is generated from the edges extended approximately in the X-direction of said photoresist patterns IRa–IRd. Said scattered light is distributed along the Y-Z plane, wherein Z-axis is perpendicular to the plane of drawing. Also if the moire-shaped patterns constitute a periodical structure resembling a diffraction grating, there is additionally generated a diffracted light component corresponding to said period. Such scattered and diffracted light is received by the photoelectric sensor in the wafer alignment system 111 and is converted into a photoelectric signal corresponding to the intensity thereof. The change in signal when the photoelectric sensor receives the diffracted light can be represented by a curve 130. If the two linear pattern groups TP1, TP2 formed by double exposures mutually cross with a cross angle 3° and if the line-and-space pitch of the pattern groups TP1, TP2 is selected equal to the pitch of the diffraction grating mark, the diffracted light component is strongest at the center, in the X-direction, of the photoresist patterns IRa–IRd, but becomes weaker on both sides.

Thus the signal processing system 112 detects the length Lnm of the photoresist pattern by fetching the above-mentioned signal and binary digitizing it with a suitable slice level. Said length Lnm is determined by the resolving power of the laser interferometer of the wafer stage ST.

As there are provided plural moire-shaped patterns of a same form along the extended direction of the slit-formed light spot SP, scattered and diffracted light is received simultaneously from said plural moire-shaped patterns in the course of the scanning operation. Consequently, even if the length of said patterns shows certain fluctuation due to an error in the production, the influence of such fluctuation will be reduced.

The above-explained measurement of the length of the photoresist pattern IR is conducted in each shot area. For example, if the measurement is conducted only on the photoresist pattern IR formed at the center of each shot area, there are required 56 measurements (56 scanning operations). Since the algorithm in the signal processing system is also simple, each measurement requires about 1 second, and the entire measurements will be completed within 1 minute. Even when 9 mark areas MA1–MA9 in each shot area are to be measured, the entire measuring operation will be completed in about 9 minutes. This period is evidently shorter than the time conventionally required for visual inspection of the vernier images. Said period is also sufficiently shorter than the conventional line width measurement with the exclusive measuring instrument.

Figure 19:
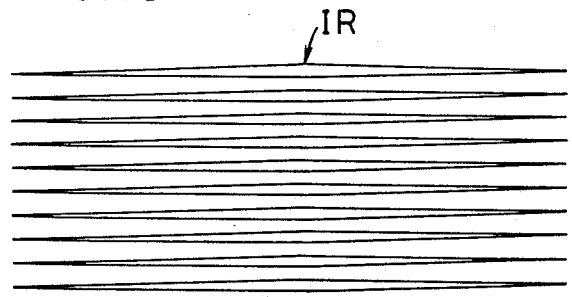
FIG. 19 is a view showing other forms of the photoresist patterns.

The linear pattern group may be so designed that the photoresist pattern IR formed by double exposures contains four or more moire-shaped patterns as shown in FIG. 19.

If the photoresist patterns IR are so formed as to cover the entire longitudinal length of the light spot SP, the amount of diffracted light increases, thus enabling measurement with an elevated S/N ratio. In this manner the lengths of the photoresist patterns IR at the center of the shot areas are measured in the order of L11, L12, ..., L21, L22, ..., L87 and are stored in the main control system 108.

Then, based on the lengths in shot areas L11, L12, ..., L87 (total 56 data), the main control system 108 selects a focus position that will give the largest pattern length Lnm under a same amount of exposure as the best focus position, and an amount of exposure that will give a pattern length Lnm equal to a predetermined length Lpp under said best exposure.

In the present embodiment, the amount of exposure without offset is selected approximately equal to the appropriate amount of exposure. Therefore eight shot areas in the vertical column for zero exposure offset, as shown in FIG. 17, are considered. Thus the pattern lengths L14, L24, L34, L44, L54, L64, L74 and L84 are compared, and the focus offset is determined corresponding to the longest photoresist pattern IR. As an example, if L44 is largest, the focus offset is $-1$ ($-0.25$ $\mu$m).

Then the lengths L41, L42, L43, L44, L45, L46 and L47 measured in seven shot areas exposed with a focus offset $-1$ and arranged in a horizontal row are compared, and there is determined an exposure offset giving a pattern length closest to the predetermined appropriate length Lpp. As an example, if L43 is closest to Lpp, the optimum exposure is determined as 190 msec involving an exposure offset of $-10$ (msec).

When the exposure offset and the focus offset are determined in the above-explained manner, the main control system 108 respectively sends said offset values to the shutter controller 106 and the auto focusing unit 109, thus setting the optimum exposure time and the optimum focus position. After said setting, wafers for device manufacture are supplied in succession through the coater-developer 120 to the stepper, and the test reticle in the stepper is replaced by the device reticle.

As explained above, the determination of the optimum exposure under a given focus condition is made by the comparison of the length Lnm of the photoresist pattern IR with a predetermined length Lpp. Said length Lpp has to be measured, prior to the determination of exposure conditions explained above, through a special method utilizing double exposures. The determination of Lpp need not be conducted before every exposure of device wafer, but may be made only once, for example at the start-up of the stepper.

The length Lpp can be determined in the following manner. In the present embodiment, there is employed a separate line width measuring apparatus, such as a length measuring scanning electron microscope (length measuring SEM).

Figure 20:
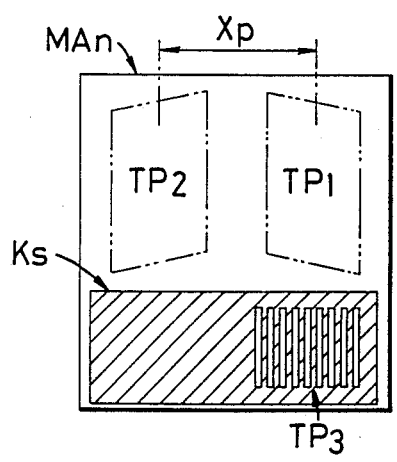
FIG. 20 is a view showing other examples of the patterns for double exposure, formed on the test reticle.

Two linear pattern groups TP1, TP2 are double exposed to the photoresist layer as explained in the foregoing. At the same time, a line-and-space pattern of a line width same as that of said two linear pattern groups is exposed. Consequently each mark area MAn of the test reticle R contains, as shown in FIG. 20, two linear pattern groups TP1, TP2, and a line-and-space pattern TP3 of a line width 1 and a spacing 1 formed in an opaque area Ks. Said pattern TP3 is formed at the right side of the mark area MAn, so that said pattern is not double exposed at the double exposures of the pattern groups TP1, TP2, particularly when the wafer stage ST is shifted by m·Xp in the x-direction.

Figure 21:
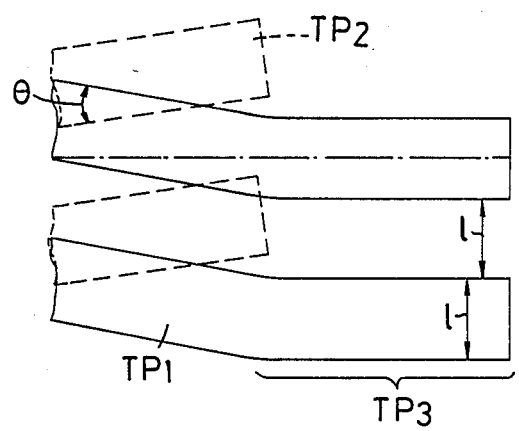
FIGS. 21 and 22 are schematic views showing the difference between the measured value and the calculated value in the length of the photoresist pattern.

Also, as shown in FIG. 21, either of the linear pattern groups TP1, TP2, for example the latter, may be extended at the right-hand end thereof, parallel to the X-axis over a predetermined length, with a line width (, thereby constituting the pattern group TP3. Such configuration enables simultaneous exposure of the pattern group TP3, either at the first exposure or the second exposure in said double exposure operation.

A test reticle R having such patterns is employed in the double exposures with variable exposure conditions as explained in relation to FIG. 17, and the photoresist is subjected to a developing process.

Then the lengths Lnm of 56 photoresist patterns IR are measured with the wafer alignment system 111 of the stepper 100, and the line width of the photoresist image in the line-and-space (L/S) pattern TP3, formed in each shot area, is measured with the length measuring SEM.

Then a focus position giving largest length Lnm of photoresist pattern IR under a fixed exposure is selected as the optimum focus position, and, among seven shot areas exposed with said optimum focus position, there is selected a shot area in which the line width of the photoresist image of the L/S pattern TP3 is closest to a predetermined line width (for example closest to m·l wherein m is the ratio of reduction). The length Lnm of the photoresist pattern IR in thus selected shot area is stored as the reference length Lpp in the main control system 108.

Figure 22:
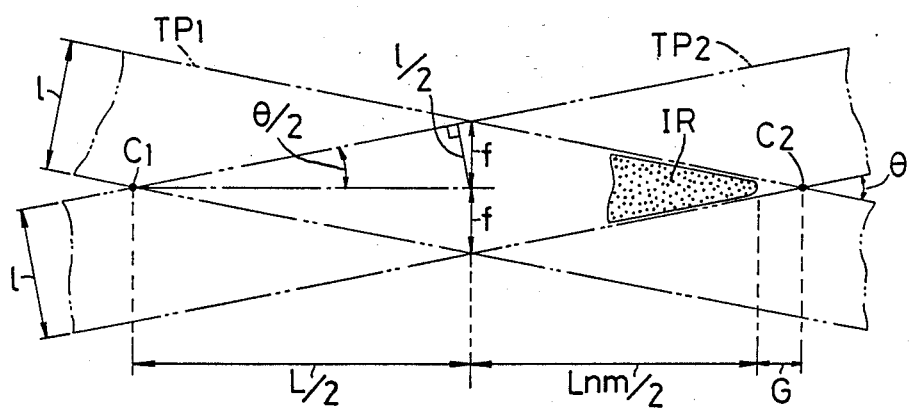

Now reference is made to FIG. 22 for explaining why such operation as explained above is required. If two linear pattern groups TP1, TP2 mutually cross with an angle $\theta$, the length of the moire-shaped photoresist pattern IR is given, in geometry, by the distance between the crossing points C1 and C2, and is represented, in approximation, by the foregoing equation (1). More strictly, however, the geometrically determined length L can be represented by the equation (4), in consideration of the relations (2) and (3) (ratio of reduction m being considered as unity).

$$f = \frac{L}{2} \cdot \tan \theta/2 \quad (2)$$

$$l/2 = f \cdot \cos \theta/2 \quad (3)$$

$$L = \frac{2f}{\tan \theta/2} = \frac{l}{\tan \theta/2 \cdot \cos \theta/2} \quad (4)$$

However, in the actual photoresist pattern, the pointed ends of the pattern are retracted from the crossing points C1, C2 by a distance G. Said distance G depends on the crossing angle $\theta$, thickness of photoresist, developing condition etc., but it is experimentally confirmed that said distance G is reproducible if other conditions are kept constant. Consequently the actual length Lnm of the photoresist pattern IR is represented by:

$$Lnm = L - 2G \approx \frac{l}{\tan \theta/2} - 2G \quad (5)$$

Thus, the determination of the length Lpp with the length measuring SEM when the line width of the L/S pattern TP3 is best transferred to the photoresist layer, corresponds indirectly to the determination of the distance G under optimum exposure conditions.

Also as will be apparent from FIG. 22, the distance L between two crossing points C1, C2 is not affected even if the superposing position of the linear patterns TP1, TP2 is displaced in the X- or Y-direction. Said distance L, or the length Lnm of the photoresist pattern IR, varies only when the line width (changes, as long as the angle $\theta$ is kept constant. Therefore, if the length Lpp is known for an optimum line width, the change in line width can be determined from the measured length Lnm.

The reference length Lpp may vary, even for same linear pattern groups TP1, TP2, if the thickness of the photoresist layer changes. For this reason it is desirable to determine the length Lpp for each of different photoresist thicknesses and to store such lengths in the main control system 108.

Also in the present embodiment, other alignment systems of the stepper may be employed for the measurement of the photoresist patterns.

Also the test reticle R shown in FIG. 14 provides photoresist patterns in 9 points in each shot area. It is therefore possible to measure the exposure conditions in said 9 points and to determine averaged exposure conditions for said 9 points in the shot area.

The optimum exposure conditions were determined, according to the method of the present embodiment, for various layers such as oxide, aluminum, PSG etc. underlying the photoresist layer, and pattern exposure was conducted with thus determined exposure conditions. Satisfactory results were obtained experimentally.

[3rd embodiment]

Figure 23:
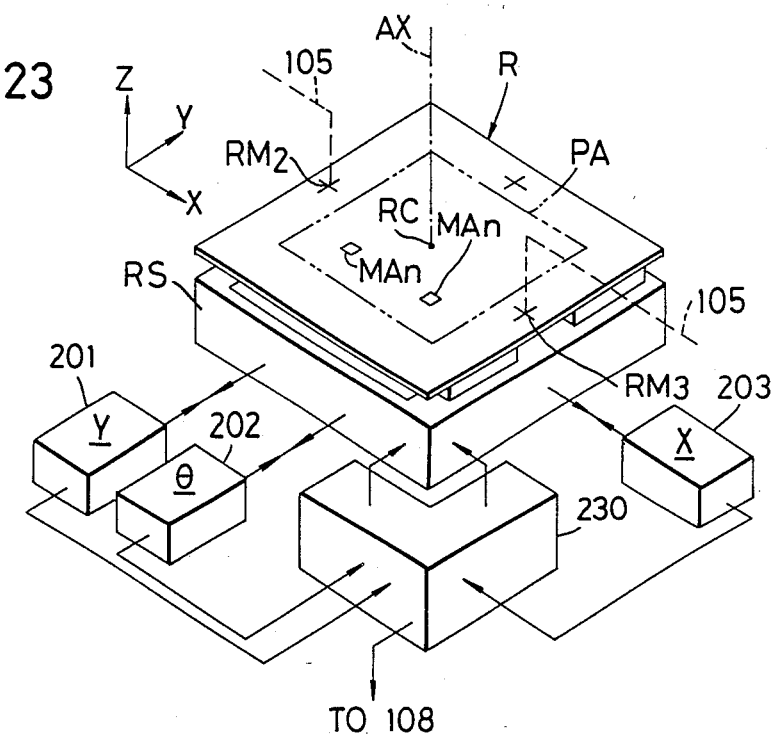
FIG. 23 is a partial perspective view of a stepper suitable for a third embodiment.

FIG. 23 is a partial view of a reticle stage RS suitable for executing the present embodiment, wherein same components as those in FIG. 13 are represented by same numbers or symbols. The optical axis AX of the projection lens PL is so positioned as to pass through the center RC of the reticle R, and the two-dimensional and rotational positions of the reticle stage RS are detected by three laser interferometers 201, 202, 203. Based on the measurements of said interferometers, the reticle stage RS controls a drive system 230 thereby defining the position (X, Y, and rotational) of the reticle R. Two interferometers 201, 202 are mutually separated by a predetermined distance in the X-direction, and both serve for measuring the displacement of the stage RS in the Y-direction. Also the difference between the measurements of said interferometers 201, 202 indicates the minute rotation of the reticle R in the X-Y plane.

Figure 24:
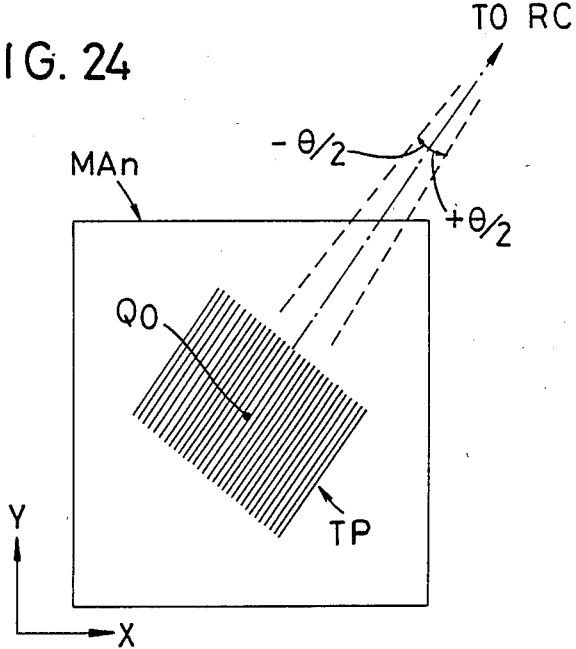
FIG. 24 is a view showing the form of linear patterns.

In the present embodiment, the linear pattern group TP, provided in the mark areas MAn on the test reticle R, contain only one kind of marks as shown in FIG. 24. The pattern group TP consists of line-and-space patterns parallel to a line connecting the center $Q_0$ of the mark area MAn and the center RC of the reticle. In the mark area MA5 at the center of the reticle R, the linear patterns in said pattern group TP may be extended in any direction, but are preferably aligned parallel to the X-direction or Y-direction.

The test reticle R having such mark areas MAn is supported on the reticle stage RS, and is correctly aligned in X, Y and rotational directions through detection of the marks RM2, RM3 by the reticle alignment system 105.

Then, from this state, the reticle stage RS is rotated by $-\theta/2$ about the optical axis AX, by means of the interferometers 201, 202, 203 and the driving system 230. In case of the second embodiment, $\theta/2 = 1.5°$. After said rotation, the rotation angle $\alpha_1$ is read by the interferometer 201, 202 and memorized. First exposures are then executed in the same manner as in the second embodiment.

Subsequently the reticle stage RS is rotated again about the optical axis AX to a position of $+\theta/2 (=1.5°)$ with respect to the position at the completion of reticle alignment. After said rotation, the rotation angle $\alpha_2$ is read by the interferometers 201, 202 and is memorized.

In this state the second exposures are conducted, with the stepping positions of the wafer stage ST identical with those in the first exposure.

In this manner, moire-shaped photoresist patterns IR are formed in the same manner as explained in the second embodiment, and the length Lnm can be measured on said patterns.

The pattern group TP3 for line width measurement as shown in FIG. 20 may also be provided in the mark area MAn shown in FIG. 24, for use in determining the reference length Lpp.

Also if the difference between the rotation angle $\alpha_1$ of the reticle in the first exposures and the rotation angle $\alpha_2$ of the second exposures does not meet the predetermined crossing angle $\theta$, the measured length Lnm can be corrected according to the difference between ($\alpha_1 - \alpha_2$) and $\theta$.

The present embodiment, in which a same linear pattern group TP is rotated by an angle $\theta$ for achieving double exposures, is capable of reducing the error in the length Lnm resulting from the error in the reticle, in comparison with the case of using two pattern groups TP1, TP2 as in the second embodiment.

In the following there will be explained a variation of the sensor of the stepper, to be employed in the measurement of the photoresist patterns IR.

Figure 25:
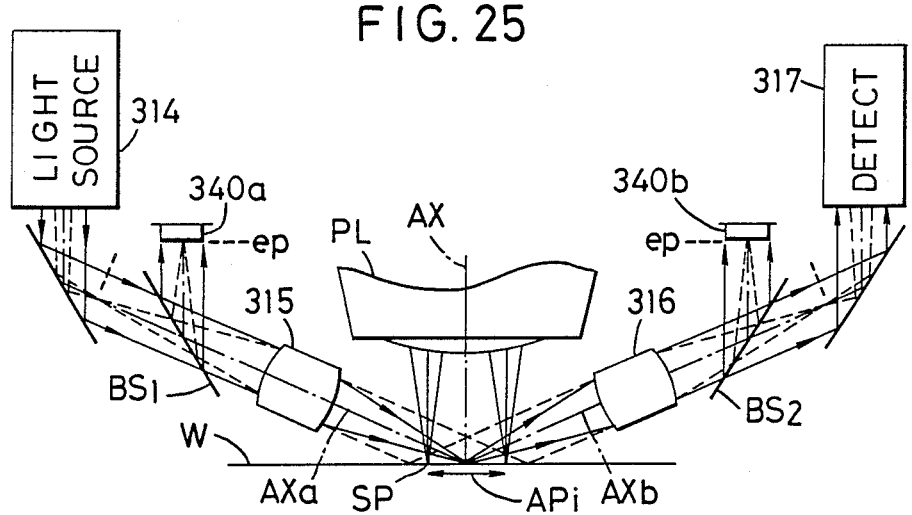
FIG. 25 is a view showing a detecting system for photoresist patterns.

FIG. 25 shows a case in which a part of a focus detecting system 114 with slanted incident light is used for detecting the scattered light from the photoresist pattern IR. The light fluxes passing through objective lenses 315, 316 are represented by solid lines, while parts conjugate with the pupil ep of the objective lens. The optical axes AXa, AXb of said objective lenses are so positioned as to cross each other at the center (optical axis AX) of a shot area Api on the wafer W. Between a light-emitting system 314 and the objective lens 315, and between the light-receiving objective lens 316 and a light-receiving system 317, there are respectively provided beam splitters (preferably dichroic mirrors) BS1, BS2, so that the scattered lights, entering from the wafer to the objective lenses, are guided to photosensor elements 340a, 340b provided in the vicinity of the pupil ep.

In case of FIG. 25 in which the optical axes AXa, AXb lie in the plane of drawing, the moire-shaped patterns in the photoresist patterns IR on the wafer W extend perpendicularly to the plane of drawing. The light spot SP irradiating the photoresist patterns IR reaches the wafer W from the wafer alignment system 111 through the projection lens PL, and is extended along the plane of drawing.

The wafer alignment system 111 as shown in FIG. 13 is generally designed to form a light spot SP in the peripheral part of the shot area Api (namely projected image of the pattern area PA), and the projection lenses 315, 316 are not necessarily positioned for efficiently receiving the scattered light.

Figure 26:
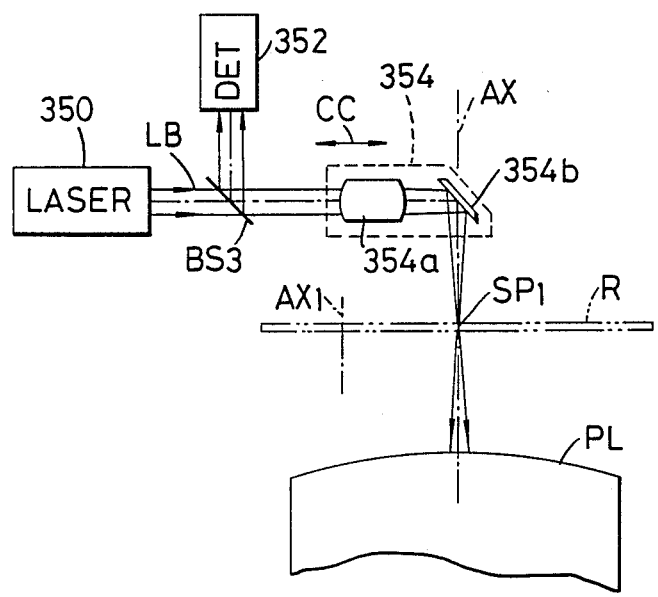
FIG. 26 is a view showing a TTR alignment system.

Therefore, as shown in FIG. 26, the formation of the light spot SP on the wafer is achieved by a through-the-reticle (TTR) alignment system, in which the alignment mark of the reticle and that of the wafer are detected from above the reticle R. A laser beam LB is emitted from a laser beam emitting system 350, incorporation a He-Ne laser, a He-Cd laser or an ion laser. Said beam LB passes through a beam splitter BS3, then guided through an alignment objective lens 354a and a mirror 354b, and vertically illuminates the reticle R. Owing to the function of a toric lens provided in the light path of the light emitting system 350, the beam LB emerging from the objective lens 354a is focused as a slit-shaped light spot SP1, on the pattern-bearing face of the reticle R, or in a space above said face and separated therefrom by a certain distance corresponding to the color aberration. The objective lens 354a and the mirror 354b are supported by a movable system 354 integrally movable along the beam axis parallel to the reticle R, as indicated by an arrow CC, so that the light spot SP1 can be placed at an arbitrary position, corresponding to the alignment marks on the reticle R. The light spot SP1 passes through the center of the pupil of the projection lens PL, as in the alignment system 111 shown in FIG. 13, and is refocused on the wafer W to constitute the light spot SP. The light returning from the alignment mark of the reticle R or the alignment mark of the wafer W is guided through the mirror 354b and objective lens 354a, then reflected by the beam splitter BS2 and enters a light receiving system 352 of the TTR alignment system. Said light receiving system 352 generates information on the alignment error in the reticle R and wafer W, according to various known methods.

In such TTR alignment system, the movable system 354 is usually set in such a manner that the light spot SP is placed at an off-axis position of the reticle R, for example at a position AX1.

Therefore, in case of measuring the photoresist pattern IR formed by double exposures, the test reticle or device reticle is unloaded, and the movable system 354 is extended to or close to the optical axis AX of the projection lens PL, so that the light spot SP is formed approximately on the axis as shown in FIG. 26. Consequently the light spot SP is positioned at the approximate center of the shot area APi of the projection lens PL, and, in the relative scanning of the photoresist pattern IR with said light spot SP, the objective lenses provided in two directions can receive the scattered light in approximately same conditions. Thus the length Lnm can be measured as in FIG. 18, by adding the photoelectric signals from the photosensors 340a, 340b and processing the obtained signal in the signal processing system 112.

In this case, the reticle R is not present in the light path of the light spot SP1, and the focus plane of the light spot SP on the wafer W is xially shifted according to the glass thickness of the reticle R. It is therefore necessary to vertically offset the Z-stage in the wafer stage ST correspondingly. Otherwise, a transparent glass plate of a thickness same as that of the reticle R may be loaded on behalf of the reticle.

Also in the arrangement shown in FIG. 25, it is possible to place the beam emitting systems instead of the photosensor elements thereby effecting dark field illumination on the photoresist pattern IR, and to observe the dark field image of said pattern with a television camera provided in the light receiving system 352 of the TTR alignment system, through the projection lens PL. In this case the length Lnm of the photoresist pattern can be measured by the analysis of the image signals from said television camera.

In the foregoing second or third embodiment, it is also possible to optically detect the latent image of moire-shaped patterns formed in the photoresist layer after double exposures. In this case there is utilized the changes of optical properties (reflectance or refractive index) between unexposed area and exposed area.

The present invention is applicable in the determination of exposure conditions, not only in the projection exposure apparatus but also proximity exposure apparatus. In the proximity exposure, the exposure condition resulting from the projection optical system, i.e. focus condition, is not required, but the mechanical gap between the mask and the wafer (20–200 μm) will have a similar meaning.

Also in the double exposures, the linear pattern or patterns to be exposed first and the linear pattern or patterns to be exposed second may be formed on different reticles.

[4th embodiment]

In the following there will be briefly explained the structure of a stepper advantageously employable in the present embodiment, ith reference to FIG. 27. A reticle is supported by a reticle stage RS finely movable in x, y and θ directions. On the lower face of the reticle R, there is formed a pattern area PA, and an image therein is projected, by the light from an illumination optical system including a condenser lens system CL, onto a shot area on the wafer W through the projection lens PL. Said projection lens PL is constructed as a telecentric system at least in the wafer side, so that an image of the light source is formed at the pupil (entrance or exit) eP of the projection lens PL.

The reticle stage RS is aligned to a predetermined position, by means of a reticle alignment microscope 41, a processing circuit 402, a control circuit 403 and a driving system 404.

On the other hand, the wafer stage ST is positioned with a precision of 0.02–0.04 μm by servo control of a driver 405 by a control circuit 407, based on the coordinate value detected by a laser interferometer 406.

The stepping motion and the movement for alignment of the wafer stage ST are all controlled by instructions from a main control system 408.

For detecting the alignment mark or a photoresist image on the wafer, there are provided two wafer mark detecting system; the first one being an LSA system 411 of TTL method similar to that shown in FIG. 1 or 13; and the second one being an off-axis wafer alignment system 415, similar to that shown in FIG. 1.

In either alignment system 411 or 415, there is employed light of a wavelength not actinic to the photoresist layer.

Figure 28:
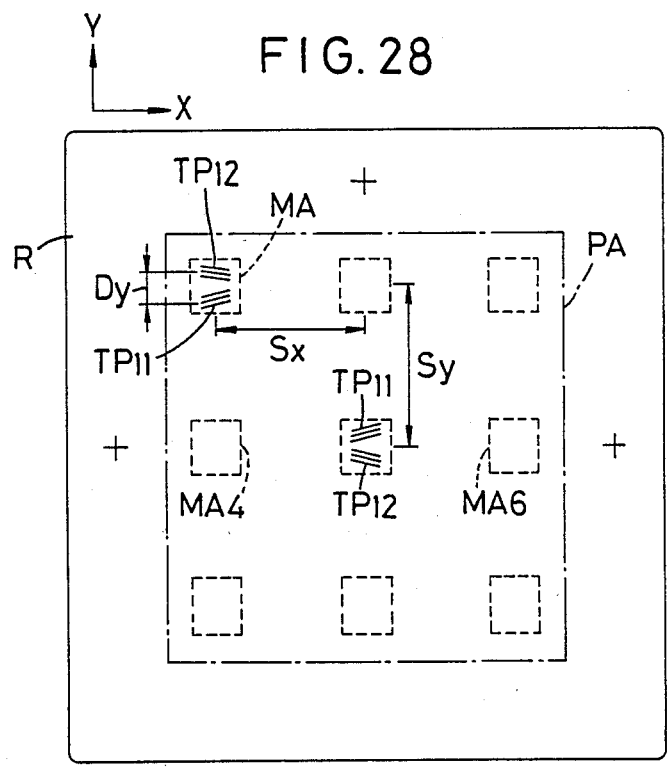
FIG. 28 is a plan view showing patterns of a test reticle suitably employed in the fourth embodiment.
Figure 29:
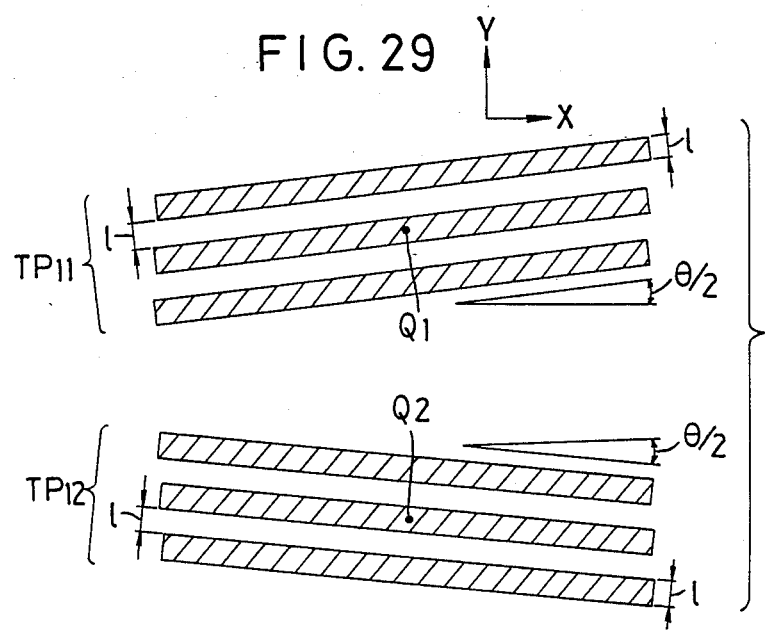
FIG. 29 is a view showing the arrangement of test patterns on the reticle.

FIG. 28 shows the pattern arrangement of a test reticle R prepared for the execution of the method of the present embodiment. Said arrangement is basically same as that shown in FIG. 14, but each pattern is constructed as shown in FIG. 29.

Each of pattern groups $TP_{11}$, $TP_{12}$ is composed of three linear opaque patterns, and said groups are inclined by an angle θ/2 in opposite directions with respect to the X-axis. Centers Q1, Q2 of the pattern groups $TP_{11}$, $TP_{12}$ are separated by a distance Dy in the Y-direction.

The test reticle R shown in FIG. 28 is loaded on the reticle stage RS of the stepper, and the projected image of the pattern area PA is printed on the photoresist layer on the wafer W by a step-and-repeat method (first print). Thus, in each shot area on the wafer, 9 mark areas are transferred as latent image in the photoresist layer. Then, superposed exposure (second print) is conducted with the same test reticle R on each of the shot areas subjected to the first exposures. In said second exposure, the projected image of the pattern area PA is exactly displaced by m.Dy (m being reduction ratio of the projection lens PL, such as 1/5 or 1/10) in the Y-direction. Through this operation, in each of 9 mark areas in a shot area on the wafer, a latent image is formed in the photoresist layer, consisting of superposition of the pattern groups $TP_{11}$ and $TP_{12}$ as shown in FIG. 30. The amount of exposure in the first print is approximately equal to that in the second print.

Thereafter the wafer W is developed, and is again loaded on the wafer stage ST. Then wedge-shaped patterns are positioned in the viewing field of an objective lens of the off-axis wafer alignment system 415, and are observed on a cathode ray tube.

On the cathode ray tube there are shown wedge-shaped patterns $IR_1$, $IR_2$, $IR_3$ indicated by hatched areas in FIG. 30. Said wedge-shaped patterns are unexposed areas in the present embodiment, and are projecting portions or recessed portions respectively positive or negative photoresist is employed.

If said off-axis alignment system 415 is capable of measuring the lengths La, Lb, Le, Lf of the wedge-shaped patterns as shown in FIG. 30, such lengths are precisely measured and compared with the reference value of width determined in advance on linear patterns of photoresist, to calculate the width of actually exposed linear patterns.

Now reference is made to FIG. 31 for explaining the principle of determining the change in line width. It is assumed that a projected image 421 of one of linear patterns $TP_{11}$ of a width l on the reticle R, and a projected image 432 of one of the linear patterns $TP_{12}$ are both aberrated, in the line width, by 2Δl from the ideal line width l'.

In case of the ideal line width l', the internal edges of two projected images 421, 422 mutually cross at a point V1. However, when the line width is changed from l' to l'+2Δl, said internal edges cross at a point V2. Consequently the geometrical crossing point moves from V1 to V5, over a distance $C_T$.

The relation between said distance $C_T$ and the crossing angle θ can be represented by:

$$C_T = \frac{\Delta l}{\sin \frac{\theta}{2}} \quad (6)$$

However, in the actual photoresist image, the pointed ends at said crossing points V1, V2 are somewhat rounded, so that the ends $U_1$, $U_2$ of wedge-shaped photoresist image are displaced by a distance D from the crossing points V1, V2. However the distance $C_0$ between the ends $U_1$ and $U_2$ is exactly equal to $C_T$ within a certain range.

In case of the wedge-shaped pattern $IR_1$ shown in FIG. 30, a change in the line width causes the pointed ends to move in mutually opposite directions, as said pattern is symmetrical in both directions on the X-axis.

For a wedge-shaped photoresist pattern $IR_1$ with an ideal line width l' and a length a in the X-direction, the change in length Δa resulting from a change Δl in the line width can be represented by an equation (7) which is derived from (6):

$$\Delta a = 2C_0 = 2C_T = -\frac{2\Delta l}{\sin\frac{\theta}{2}} \quad (7)$$

Signs in this equation indicate that a smaller length a (negative $\Delta a$) is caused by an increase of the line width by $2\Delta l$. Said equation (7) can also be rewritten as (8):

$$2\Delta l = -\Delta a \cdot \sin\frac{\theta}{2} \quad (8)$$

Therefore, if a line width $l_0$ of a suitable linear photoresist image and a corresponding length $a_0$ of a wedge pattern $IR_1$ are stored as reference data, it is possible to measure the actual length $a'$ of the wedge pattern $IR_1$ and to determine the line width $l'$ of said linear photoresist pattern from the equation (9):

$$\begin{aligned} l' &= l_0 + 2\Delta l \quad (9) \\ &= l_0 - (a' - a_0)\sin\frac{\theta}{2} \end{aligned}$$

The determination of the length $a_0$ in correspondence to the line width $l_0$ corresponds to the determination of the distance D between the geometrical crossing point V1 (or V2) and the actual end position U1 (or U2) of the wedge pattern.

Said distance D is somewhat variable for example by the amount of double exposures or by the defocus between the projection lens PL and the wafer W, but is substantially constant for a given thickness of photoresist, if the exposure conditions are maintained same in the first and second exposures.

Also for the line width measurement, there may be employed other wedge patterns $IR_2$ or $IR_3$ shown in FIG. 30, as will be explained in the following. FIG. 32A illustrates the wedge pattern $IR_2$ when two linear pattern groups are superposed in an ideal positional relationship. If the dimension Le of said pattern $IR_2$ in the X-direction is determined as $e_1$, the line width can be easily determined from the foregoing equations. In this case, however, if the superposition of two linear pattern groups is displaced in the X- or Y-direction, said dimension Le becomes smaller than $e_1$ though there is no change in the line width. For this reason, there are measured the width $y_2$ in Y-direction and the length $e_2$ of said pattern $IR_2'$, then the aberration in superposition $\Delta y = y_1 - y_2$ is calculated, and the amount of displacement of the pointed end of the wedge resulting from the positional aberration Ay is determined as follows;

$$\Delta e = e_1 - e_2 = \Delta y \cdot \cot\frac{\theta}{2}$$

The line width can be determined from the equation (9) after the measured value $e_2$ is corrected with $\Delta e$.

It is also possible to utilize two wedge patterns $IR_2$ and $IR_3$. If the pattern is displaced in the X- or Y-direction in the superposition, the dimension Le of the pattern $IR_2$ at left and the dimension Lf of the pattern $IR_3$ at right vary in mutually complementary manner. More specifically, if the pattern $IR_2$ becomes shorter by $\Delta e$, the pattern $IR_3$ becomes longer by $\Delta e$.

It is therefore possible to measure the lengths Le, Lf of two wedge patterns $IR_2$, $IR_3$ and to use sum (Le+Lf), which is not influenced by the aberration in the superposition but is variable only depending on the change in the line width.

As will be apparent from the foregoing description, determination of the sum of lengths Le, Lf of the patterns $IR_2$, $IR_3$ is equivalent to the measurement of the distance Lb between the pointed ends of two patterns $IR_2$ and $IR_3$. It is therefore also possible to directly measure said distance Lb.

Figure 27:
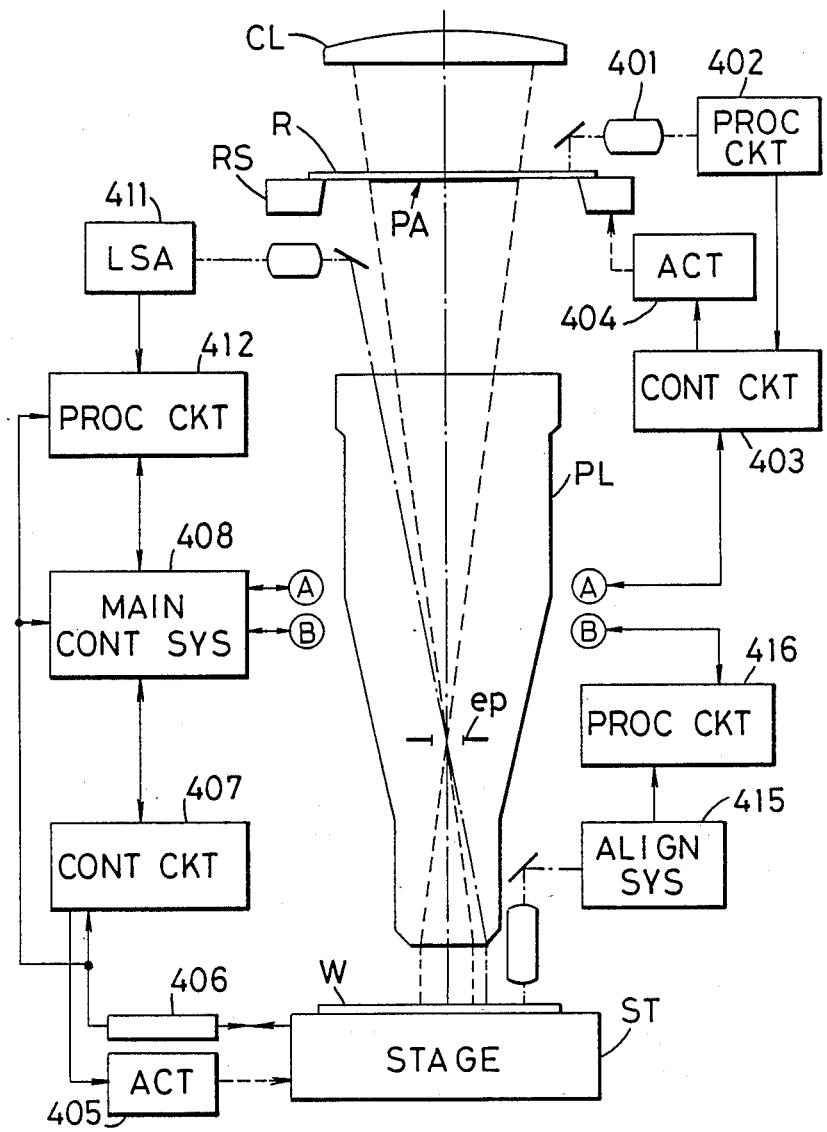
FIG. 27 is a view showing a projection exposure apparatus constituting a fourth embodiment of the present invention.

In the following there will be explained an experimental example, in which a line-and-space pattern with a line width of 0.8 μm was formed on a wafer by means of a projection exposure apparatus as shown in FIG. 27.

The projection exposure apparatus utilized g-line light for exposure and had a projection lens with a numerical aperture of 0.45. The substrate was a bare silicon wafer coated with positive photoresist with a thickness of 1.0 μm. Each of the linear pattern groups $TP_{11}$, $TP_{12}$ on the test reticle R consisted of a pattern of 5 opaque lines for forming a projected image with a line width of 0.8 μm on the wafer, and the double exposures were conducted as explained before with a crossing angle of 3° between said pattern groups. In the superposed exposures, the amount of exposure in each shot area was maintained same for the first and second exposure, but the amount of exposure was varied in succession by 10 msec in different shot areas. The photoresist patterns formed on the wafer by development were enlarged through an optical microscope and observed through an ITV camera.

Then the length La of the wedge patterns $IR_1$ was determined in relation to the amount of exposure.

At the same time, a length measuring SEM was used to obtain reference data that the line width ($l_0$) of 0.78 μm corresponded to the dimension La of 20 μm ($a_0$) of the wedge pattern $IR_1$.

Then the length La of the wedge pattern $IR_1$ was measured as 22.5 μm with an optical microscope, and the line width of linear patterns constituting the wedge portion was identified as 0.847 μm with a SEM.

On the other hand, the equation (9) provided a line width of 0.845 μm for conditions of $\theta = 3°$, $a_0 = 20$ μm, $l_0 = 0.78$ μm $a' = 22.5$ μm, and this result well matched with the actual value measured with the SEM.

Also a simicon wafer bearing a sputtered aluminum layer of 1 μm in thickness and a positive photoresist layer of 5 μm in thickness was subjected to superposed exposures under the same conditions as explained above. It was confirmed that the actual value of line width measured with the SEM satisfactorily coincided with the calculated value obtained from the equation (9).

In the foregoing embodiment, there is employed linear pattern groups extended only in the X-direction. The projection lens of this kind has an extremely high resolving power, but, at an arbitrary image height in an off-axis position, the resolving power may not necessarily be isotropic and may show a slight change (for example 0.1 μm or less), as a kind of distortion in the projection lens.

In the following there will therefore be given an example of reticle pattern suitable for measuring the line width two-dimensionally at a point in the exposure field.

Figure 33:
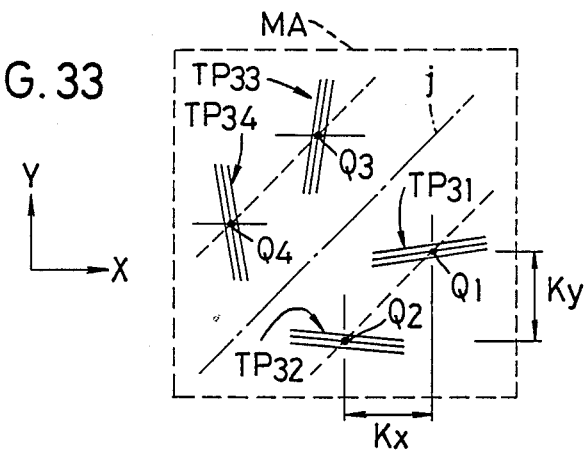
FIG. 33 is a view showing a variation of the patterns on the reticle.

FIG. 33 shows a pattern to be formed in each of the mark areas MA in the test reticle R shown in FIG. 28. The form and crossing angle of the pattern groups $TP_{21}$, $TP_{22}$ for measurement in the Y-direction are same as those of the groups $TP_{11}$, $TP_{12}$ shown in FIG. 28, except that the centers $Q_1$ and $Q_2$ of said pattern groups are mutually displaced by Kx and Ky respectively in the X- and Y-direction, and said pattern groups are formed in the lower right portion of the mark area MAn in such a manner that the line connecting said centers $Q_1$ and $Q_2$ is inclined by 45° to the X- or Y-axis, so that Kx=Ky. Also two linear pattern groups $TP_{33}$, $TP_{34}$ for measurement in the X-direction are positioned in symmetry to the pattern groups $TP_{31}$, $TP_{32}$ with respect to the central line j of an angle of 45°.

In case of using such mark area MA, the second exposure can be made by moving the projected image of the mark area MA by Kx and Ky respectively in the X and Y-direction with respect to the shot area on the wafer.

Therefore, for a reduction ratio m, the stepping coordinates for the second exposure should be offset by (m·Kx, m·Ky) with respect to the stepping coordinates in the first exposure, and such offsetting can be automatically achieved by the main control system 408 of the stepper. It is also possible, instead of varying the stepping coordinates, to effect the second exposure after moving the reticle stage RS, supporting the reticle R, by (Kx, Ky) in the X- and Y-directions with the driving system 404.

With respect to the arrangement of the linear pattern groups shown in FIG. 33, it is preferable, in the central mark area only, to interchange the pattern groups $TP_{31}$ and $TP_{32}$, and the pattern groups $TP_{33}$ and $TP_{34}$, as already explained in relation to FIG. 28. Such arrangement will be extremely useful in superposed exposures for inspecting various precisions.

In the following there will be explained a method of measuring positional aberration utilizing superposed exposures. This method is extremely useful in checking various precisions of the stepper, such as the stepping precision of the wafer stage ST, the alignment precision of the alignment system, and the distortion of the projection lens (including error in image magnification), and can be utilized in the self-diagnosis of the stepper for optimizing the control of these precisions.

Figure 34:
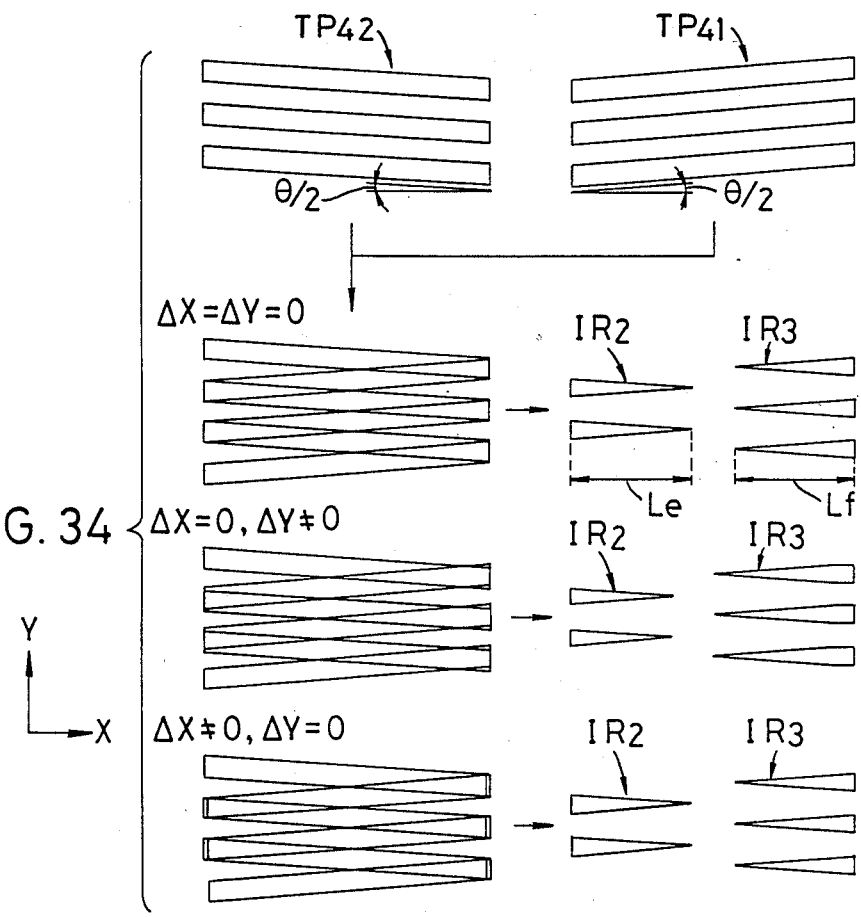
FIG. 34 is a view schematically showing the mode of measurement of positional aberration by double exposures.

At first reference is made to FIG. 34 for explaining the working principle of this method. Linear pattern groups $TP_{41}$, $TP_{42}$ are same as the pattern groups $TP_1$, $TP_2$ shown in FIG. 29, except that the entire length is halved.

These two pattern groups $TP_{41}$ and $TP_{42}$ are formed for example in a same reticle, with a predetermined distance therebetween.

Two pattern groups $TP_{41}$ and $TP_{42}$ are double exposed. When the two pattern groups are exactly superposed in X- and Y-directions ($\Delta x = \Delta y = 0$), the lengths Le, Lf in X-direction of the wedge patterns $IR_2$, $IR_3$ formed at left and right in the photoresist layer on the wafer become mutually equal. On the other hand, if two pattern groups are displaced each other in the Y-direction, the length Le of the wedge pattern IR become shorter by $\Delta Lx/2$, while the length Lf of the wedge pattern $IR_3$ becomes longer by $\Delta Lx/2$.

Also if two pattern groups are displaced only in the X-direction, the wedge patterns $IR_2$ and $IR_3$ show same dimensional changes, so that the difference of Le and Lf remains zero.

Consequently, the double exposures of two linear pattern groups $TP_{41}$ and $TP_{42}$ extending substantially in the X-direction allow to identify the error component $\Delta Y$ of superposition in the Y-direction. Thus, if the measurement of two-dimensional aberration is necessary, there can be employed linear pattern groups arranged in two directions, as shown in FIG. 33.

Positional aberration (error) $\Delta Y$ can be determined from the equation (10), based on the lengths Le, Lf of the wedge patterns $IR_2$ and $IR_3$.

$$\Delta Y = (Lf - Le) \cdot \tan \frac{\theta}{2} \qquad (10)$$
$$= \Delta Lx \cdot \tan \frac{\theta}{2}$$

In the present embodiment, even if the line width is changed by the exposure conditions or developing conditions, the difference $\Delta Lx$ remains same since the lengths Le and Lf are changed by a same amount. Thus said difference is exclusively proportional to the aberration in the superposition in double exposures.

Then explained is a method of measuring the stepping precision of the stepper.

The test reticle R used for this purpose is provided, as shown in FIG. 35A, with mark areas MAp in which pattern groups $TP_{52}$ and $TP_{53}$ are formed in mutually perpendicular relationship, and mark groups MAs in which pattern groups $TP_{51}$ and $TP_{54}$ are formed in mutually perpendicular relationship, in mutually different plural positions. The inclination of each pattern group with respect to the X- or Y-axis is same as in FIG. 33. It is also possible to form plural linear pattern groups in the X- or Y-direction as shown in FIG. 35B, whereby the wedge patterns (moire patterns) $IR_2$, $IR_3$ constitute a diffraction grating with a certain repeating interval.

This test reticle is utilized for measuring the stepping precision of the stepper.

In FIG. 36, SA1 indicates a shot area in the first exposure. In two positions J, K which are separated by a distance $X_1$ in the X-direction, or which correspond to the mark area $MA_4$ and $MA_6$ in the reticle pattern shown in FIG. 28, there are formed latent images of the mark areas MAp, MAs shown in FIG. 35A. After said first exposure, the wafer stage ST is precisely stepped by $X_1$ in the X-direction, and the second exposure is carried out. Thus the projected image of the mark area MAp is superposed on the latent image of the mark area MAs at the position K in the shot area SA1. The broken-lined shot area $SA_2'$ indicates the case of ideal stepping, with zero stepping errors ($\Delta X$, $\Delta Y$). If there is any stepping error, the second shot area SA2 will show slight positional aberrations $\Delta X$, $\Delta Y$ at the position K in the X- and Y-directions.

When the double exposed wafer is developed, the photoresist image MAs' in the mark area MAs at the position K provides wedge patterns IRx and IRy. Thus the positional aberrations $\Delta X$, $\Delta Y$ in the X and Y-directions can be determined from the difference $\Delta Lx$ of the lengths Le, Lf of said wedge patterns IRx, IRy as already explained in FIG. 34, and utilizing the equation (10).

Similarly the stepping error in the Y-direction can be determined by forming the mark areas MAp and MAs with a distance $Y_1$ therebetween in the Y-direction, in a shot area.

As shown in FIG. 28, the shot area contains three sets of mark areas separated by a distance $X_1$ (=2×Sx) or $Y_1$ (=2×Sy), both in the X- and Y-directions, so that the wedge patterns IRx, IRy resulting from double exposures are formed in three positions in the shot area. It is therefore possible to determine the yawing (small rotation in the x-y plane) at the stepping of the wafer stage ST, by comparing the stepping errors (ΔX, ΔY) of these three images.

In the following there will be explained the method of inspecting the error in magnification or the distortion of the projection lens. There is employed a test reticle which, as shown in FIG. 37, forms a mark area MAp as shown in FIGS. 35A or 35B in the first exposure at a position J at the center of the shot area SA1 or in the vicinity of the reticle center RC corresponding to the optical axis AX of the projection lens PL, and simultaneously forms a mark area MAs at a corner position K of said shot area SA1. If the projection lens contains a distortion or a magnification error, the mark area MAs which should be exposed in the position K is exposed in a position K' displaced by (ΔX, ΔY). The second exposure is conducted after a movement of the wafer stage ST by a distance ($X_2$, $Y_2$) corresponding to the design distance between J and K.

In this manner, the image MAs' of the mark area in the corner of the shot area SA1 generates wedge patterns IRx, IRy as shown in FIG. 36, thus enabling to determine the aberrations (ΔX, ΔY), which are equal to the amount of magnification error or distortion of the projection lens in this position.

It is therefore possible to inspect the distortion (magnification error) around the optical axis AX of the projection lens, by conducting the above-explained operation in arbitrary positions within the shot area SA1.

It is to be noted that the stepping pitch ($X_2$, $Y_2$) shown in FIG. 37 is related with the distance (Sx, Sy) of the mark areas shown in FIG. 28 by $X_2 = m \times Sx$ and $Y_2 = m \times Sy$. Also the test reticle having the mark areas MA shown in FIG. 33 can be used also for distortion measurement if the inclination of the linear patterns is selected complementary between the central mark area $MA_5$ and other mark areas.

The lengths of thus formed wedge patterns $IR_1$, $IR_2$, $IR_3$ are automatically measured, as in the foregoing embodiments, by the alignment system of the stepper.

As the wedge patterns $IR_1$, $IR_2$, $IR_3$ are composed of organic materials, luminescence or phosphorescence may be generated by ultraviolet irradiation. It is therefore possible to place the developed wafer on the stage ST, to irradiate said wafer with the exposure light (g-line, i-line, excimer laser light etc.) for a certain period by means of the illumination system of the stepper without the test reticle, and to photoelectrically detect the luminescence or phosphorescence from the wedge patterns, by means of the off-axis wafer alignment system.

Figure 38:
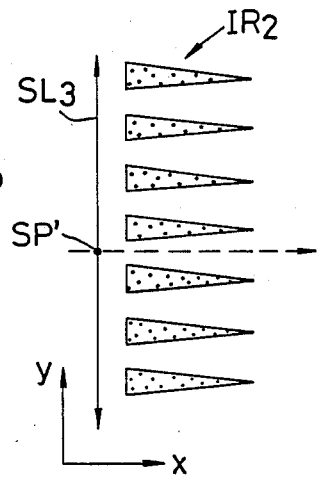
FIG. 38 is a view showing an example of dimensional measurement with circular light spot.

Photoelectric detection of wedge patterns may be conducted, as shown in FIG. 38, by high-speed scanning with a small circular light spot SP' in the Y-direction, combined with a slow movement of the wafer stage ST in the X-direction. The length of the wedge patterns can be measured from the change in the signal corresponding to the light scattered for example from the edge of the pattern $IR_2$, and the change in the scanning position in the X-direction. For example, in a single wedge-shaped pattern, the distance of peaks in the Y-direction, corresponding to the light scattered by two edges varies according to the position of stage in the X-direction. It is therefore possible to determine the length of the wedge pattern, by said peak distance at least in two positions in the X-direction.

Also a reticle R with a pattern arrangement as shown in FIG. 28 can quantitatively check the precision of the reticle alignment systems 401-404, particularly the amount of rotation.

The reticle R is aligned by the reticle alignment system in such a manner that the rotation is eliminated at two mark positions $RM_2$, $RM_3$. However, if the reticle alignment system involves an offset or a drift, the reticle R will be aligned with a certain rotation. Such rotation error of the reticle alignment system can be known by determining positional aberration ΔY in the Y-direction in two positions, utilizing double exposed photoresist image for example at the mark areas $MA_4$, $MA_6$ on the reticle R and obtaining the difference of said positional aberrations. In this operation, the wafer stage ST is moved by Dy (or Ky) in the Y-direction for the second exposure. In order to avoid the influence of yawing of the stage ST in said movement, there may be provided a differential interferometer for measuring the amount of yawing of the stage ST. The rotational error of the reticle can be exactly determined by the correction for said yawing.

Figure 39:
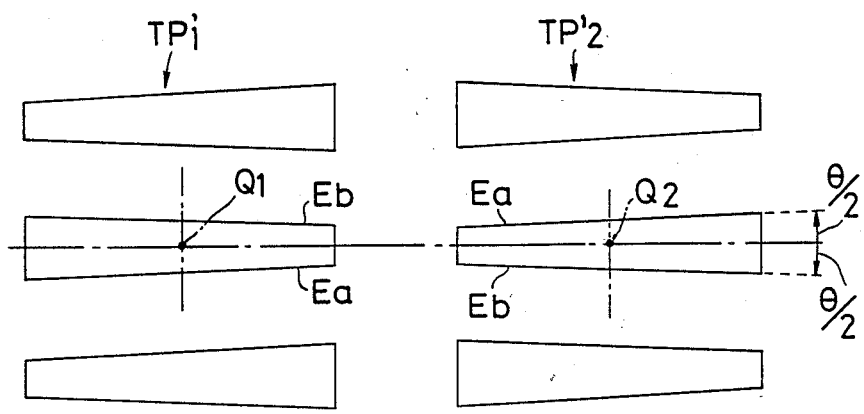
FIG. 39 is a view showing another example of linear patterns.

FIG. 39 shows a variation of two linear pattern groups $TP_1'$, $TP_2'$, in which the linear patterns extend exactly in the X-direction, but edges Ea, Eb are inclined by $\theta/2$ with respect to the X-axis. Wedge-shaped patterns can also be obtained by double exposures of such linear pattern groups.

We claim:

1. An exposure method for use in an apparatus for projecting a pattern formed on a mask onto a photosensitive substrate through a projection optical system, comprising the steps of:

providing a mask bearing a pattern of which width gradually varies in a reference direction on the mask;

transferring said pattern onto said photosensitive substrate through said projection optical system;

measuring the length of pattern transferred onto said photosensitive substrate, in a reference direction on said substrate corresponding to said reference direction of the mask;

determining optimum exposure conditions for said projection exposure, from thus measured length of the pattern; and controlling the exposure according to said conditions.

2. A method of measuring exposure conditions for a photosensitive substrate having a photoresist layer thereon, in an exposure apparatus for exposing said photosensitive substrate, maintained in a reference exposure plane, to the pattern of a mask, comprising the steps of:

exposing each of plural partial areas on said photosensitive substrate to a first linear pattern in succession under different exposure conditions;

exposing each of said plural partial areas, in superposition, to a second linear pattern which crosses the latent image of said first linear pattern formed in said photoresist layer, with a predetermined angle, in succession under different exposure conditions;

measuring the dimension of a photoresist image formed in said photoresist layer by the superposed exposures of said first and second linear patterns, in each of said plural partial areas; and determining said exposure condition based on the difference in thus measured dimensions.

3. A method according to claim 2, wherein the exposure condition for said first linear pattern is selected substantially equal to that for said second linear pattern in each of said partial areas.

4. A method according to claim 2, wherein said exposure condition includes the small distance between the surface of said photosensitive substrate and said reference exposure plane as a first condition, and the amount of energy given to said photosensitive substrate as a second condition; and the exposure of said first and second linear patterns is conducted at least in one of a first mode in which the exposures are made with the fixed first condition and with the successively varied second condition, and a second in which the exposure are made with the fixed second condition and with the successively varied first condition.

5. A method according to claim 4, wherein said exposure apparatus comprises a projection optical system for projecting the image of the pattern of said mask onto a best image plane defined as said reference exposure plane, and said first condition is the amount of focus corresponding to the distance between the surface of said photosensitive substrate and said best image plane.

6. A method according to claim 2, wherein superposed exposures of said first and second linear patterns are conducted with a crossing angle of the edges of said two linear patterns not exceeding 45° but not equal to 0°, thereby forming a photoresist image of wedge shaped or moire fringe shaped pattern.

7. A method according to claim 1, wherein each of said first and second linear patterns is composed of an alternate arrangement of opaque portions and light-transmitting portions at a substantially constant pitch.

8. A line width measuring method, comprising the steps of:

exposing a photoresist layer on a photosensitive substrate to a first linear pattern of a predetermined width;

exposing the photoresist image of said first linear pattern, in superposition, to a second linear pattern of a predetermined width in such a manner as to cross the photoresist image of said first linear pattern with a predetermined angle;

measuring the dimension of the photoresist image formed by the superposition of said first and second linear patterns; and determining the line width of said photoresist image, based on thus measured value and the crossing angle of said two linear patterns.

9. A method according to claim 8, further comprising a step of developing the photoresist layer on said substrate, wherein said dimension to be measured of said photoresist image is the dimension between small step edges of said photoresist image formed in said photoresist layer by said development.

10. A method according to claim 8, wherein the crossing angle of the edges of the photoresist image of said first linear pattern and of said second linear pattern is selected as an acute angle not exceeding 90°, and said dimension to be measured of the photoresist image is the distance between an end point at an acute angle portion in the photoresist image formed by said superposition and a predetermined reference point.

11. A method according to claim 8, wherein said first and second linear patterns are formed in different portions on a same mask, with said predetermined angle therebetween.

12. A method according to claim 8, wherein each of said first and second linear patterns is formed in plural units in substantially parallel manner, whereby the superposed exposure of said plural first and second linear patterns provides a photoresist image in a moire fringe pattern.

13. An inspection method for an exposure apparatus, comprising the steps of:

exposing a photoresist layer on a photosensitive substrate to a first linear pattern of a predetermined width on a mask by means of said exposure apparatus;

moving said mask and said photosensitive substrate in relative manner by a predetermined amount in said exposure amount in such a manner that a second linear pattern of a predetermined width, which is formed in a position on said mask different from the position of said first linear pattern and which is so positioned as to cross said first linear pattern with a predetermined angle, is superposed with the photoresist exposed image of said first linear pattern;

after said relative movement, printing said second linear pattern in superposition with the photoresist image of said first linear pattern by means of said exposure apparatus;

measuring the dimension of a photoresist image formed by the superposition of said first and second linear images;

calculating the positional aberration in the superposition of said first and second linear patterns, based on said measured value and the crossing angle of said two linear patterns; and determining the precision of said exposure apparatus based on said positional aberration.

14. A method according to claim 13, wherein each of said first and second linear pattern is composed of plural parallel elements of a substantially equal length, and the superposed exposures of said plural elements of the first linear pattern and said plural elements of the second linear pattern generates two wedge-shaped photoresist images both pointed toward the center, and the length of said photoresist image is measured as said measured value.

* * * * *